US010366736B2

(12) United States Patent
Bill et al.

(10) Patent No.: US 10,366,736 B2
(45) Date of Patent: *Jul. 30, 2019

(54) MTP-THYRISTOR MEMORY CELL CIRCUITS AND METHODS OF OPERATION

(71) Applicant: Synopsys, Inc., Mountain View, CA (US)

(72) Inventors: Colin Stewart Bill, Cupertino, CA (US); Harry Luan, Saratoga, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/698,447

(22) Filed: Sep. 7, 2017

(65) Prior Publication Data

US 2018/0130514 A1 May 10, 2018

Related U.S. Application Data

(60) Continuation of application No. 15/283,254, filed on Sep. 30, 2016, now Pat. No. 9,761,295, and a division of application No. 15/045,112, filed on Feb. 16, 2016, now Pat. No. 9,484,068.

(60) Provisional application No. 62/117,275, filed on Feb. 17, 2015.

(51) Int. Cl.
*G11C 11/39* (2006.01)
*G11C 5/06* (2006.01)
*G11C 16/14* (2006.01)
*G11C 16/04* (2006.01)
*H01L 29/74* (2006.01)

(Continued)

(52) U.S. Cl.
CPC .............. *G11C 11/39* (2013.01); *G11C 5/06* (2013.01); *G11C 5/063* (2013.01); *G11C 16/0466* (2013.01); *G11C 16/14* (2013.01); *H01L 27/1027* (2013.01); *H01L 29/7404* (2013.01); *H01L 29/7436* (2013.01); *H01L 29/792* (2013.01)

(58) Field of Classification Search
CPC ...................................................... G11C 11/39
USPC ..................................................... 365/185.05
See application file for complete search history.

(56) References Cited

U.S. PATENT DOCUMENTS 5,754,475 A * 5/1998 Bill ..................... G11C 11/5621
365/185.2
6,128,216 A 10/2000 Noble, Jr. et al.
(Continued)

FOREIGN PATENT DOCUMENTS

JP H1117177 1/1999

OTHER PUBLICATIONS

PCT International Search Report and Written Opinion, PCT Application No. PCT/US2016/018121, dated May 29, 2016, 10 pages.

*Primary Examiner* — Huan Hoang
*Assistant Examiner* — Jay W. Radke
(74) *Attorney, Agent, or Firm* — Fenwick & West LLP

(57) ABSTRACT

An MTP (Many Times Programmable) memory cell for integrated circuit memory arrays is described. The cell includes an MTP device and a thyristor interconnected so that the MTP device triggers the thyristor to turn on during a Read or Verify operation. The difference in threshold voltages between a data memory cell and a reference memory cell is used to determine the information in the data memory cell. Different memory cell structures may be constructed for different memory array requirements.

20 Claims, 29 Drawing Sheets

(51) Int. Cl.
*H01L 27/102* (2006.01)
*H01L 29/792* (2006.01)

(56) References Cited

U.S. PATENT DOCUMENTS

| | | | |
|---|---|---|---|
| 6,314,050 B1 * | 11/2001 | Yi | G11C 7/1051 365/189.05 |
| 6,690,039 B1 | 2/2004 | Nemati et al. | |
| 7,242,607 B2 | 7/2007 | Kim | |
| 7,738,274 B1 | 6/2010 | Nemati et al. | |
| 8,324,656 B1 | 12/2012 | Gupta et al. | |
| 8,519,431 B2 | 8/2013 | Nemati et al. | |
| 8,576,607 B1 | 11/2013 | Nemati | |
| 9,484,068 B2 | 11/2016 | Bill et al. | |
| 2004/0104400 A1 | 6/2004 | Farid et al. | |
| 2005/0128781 A1 | 6/2005 | Kang | |
| 2005/0128785 A1 | 6/2005 | Kang | |
| 2005/0128798 A1 | 6/2005 | Kang | |
| 2005/0237779 A1 | 10/2005 | Kang | |
| 2005/0247962 A1 | 11/2005 | Bhattacharyya | |
| 2005/0269628 A1 | 12/2005 | King | |
| 2006/0011940 A1 | 1/2006 | Nemati et al. | |
| 2006/0043411 A1 | 3/2006 | Bhattacharyya | |
| 2007/0133258 A1 | 6/2007 | Kim | |
| 2007/0133259 A1 | 6/2007 | Kim | |
| 2009/0108287 A1 | 4/2009 | Nguyen et al. | |
| 2009/0213648 A1 | 8/2009 | Slesazeck | |
| 2011/0007578 A1 | 1/2011 | Okhonin et al. | |
| 2011/0019481 A1 | 1/2011 | Luthra | |
| 2012/0228629 A1 | 9/2012 | Nemati | |
| 2012/0314483 A1 | 12/2012 | Tsukada | |
| 2013/0314986 A1 | 11/2013 | Nemati et al. | |
| 2014/0003140 A1 | 1/2014 | Gupta | |
| 2014/0247651 A1 | 9/2014 | Tsukada et al. | |
| 2014/0349450 A1 | 11/2014 | Okhonin et al. | |
| 2015/0228325 A1 | 8/2015 | Tsukada et al. | |
| 2016/0240228 A1 | 8/2016 | Bill et al. | |
| 2016/0329094 A1 | 11/2016 | Luan et al. | |

* cited by examiner

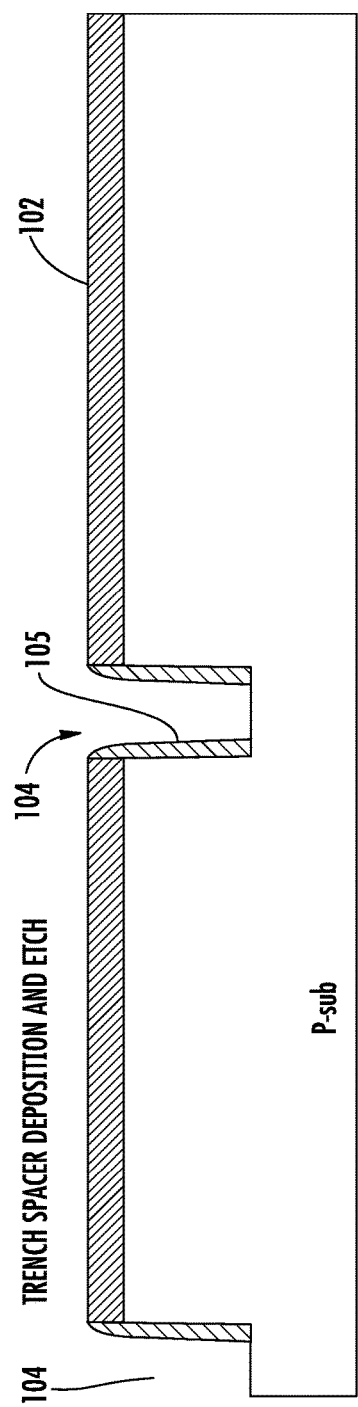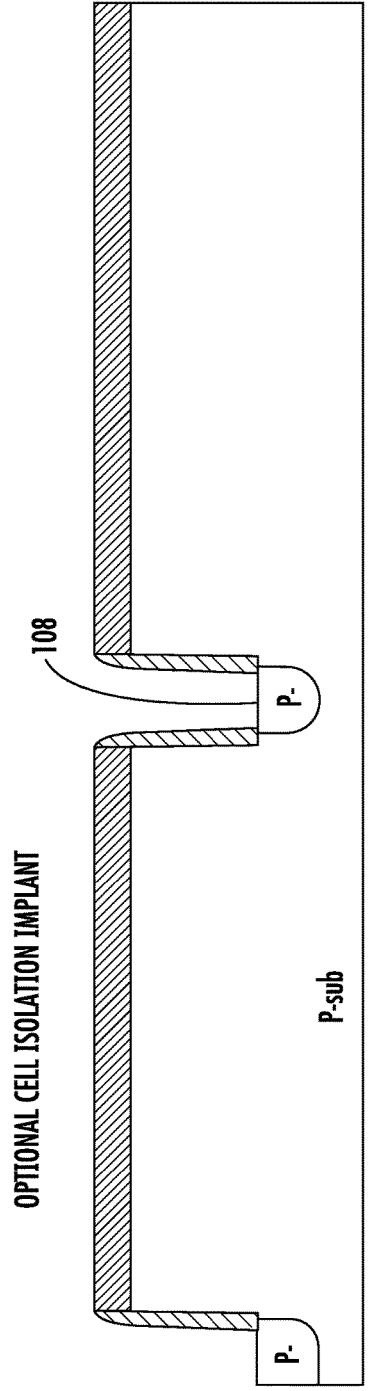
FIG. 4
FIG. 5

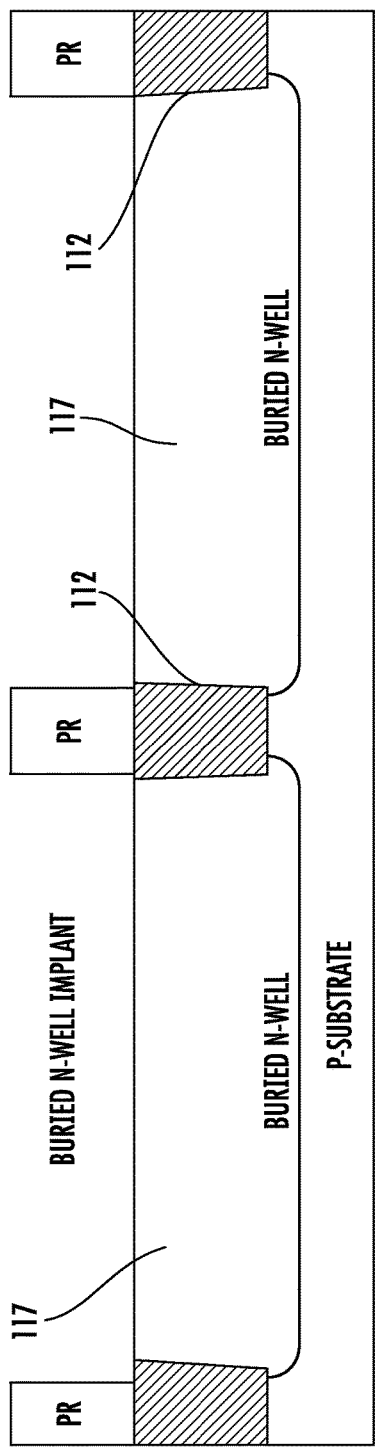
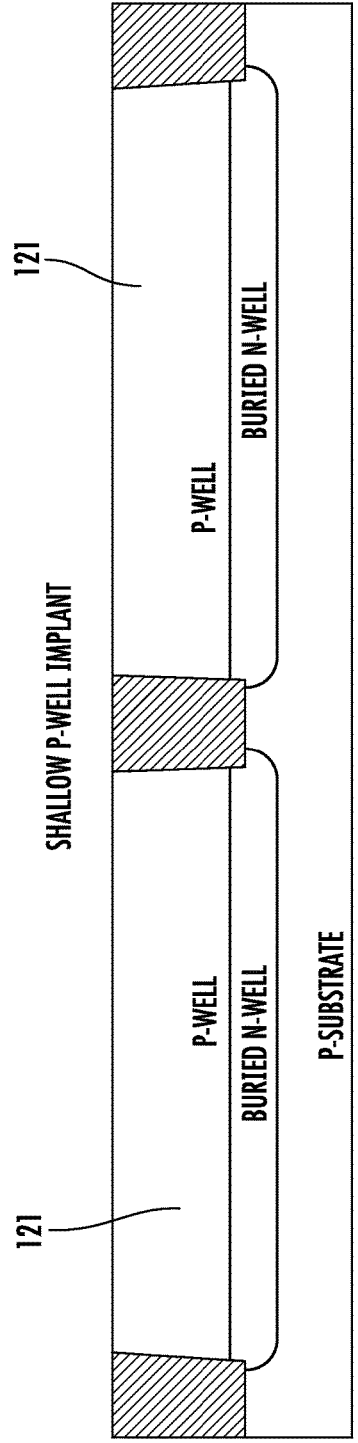

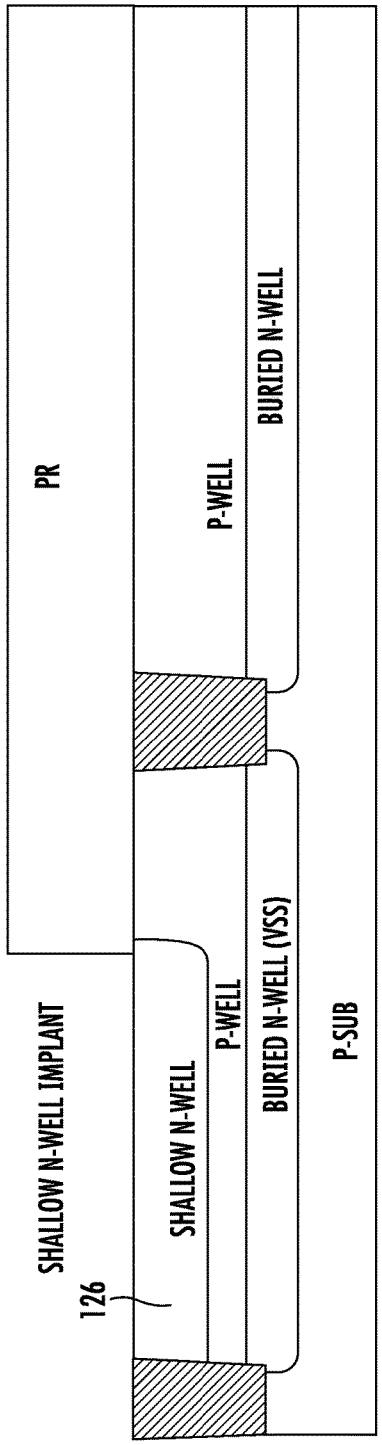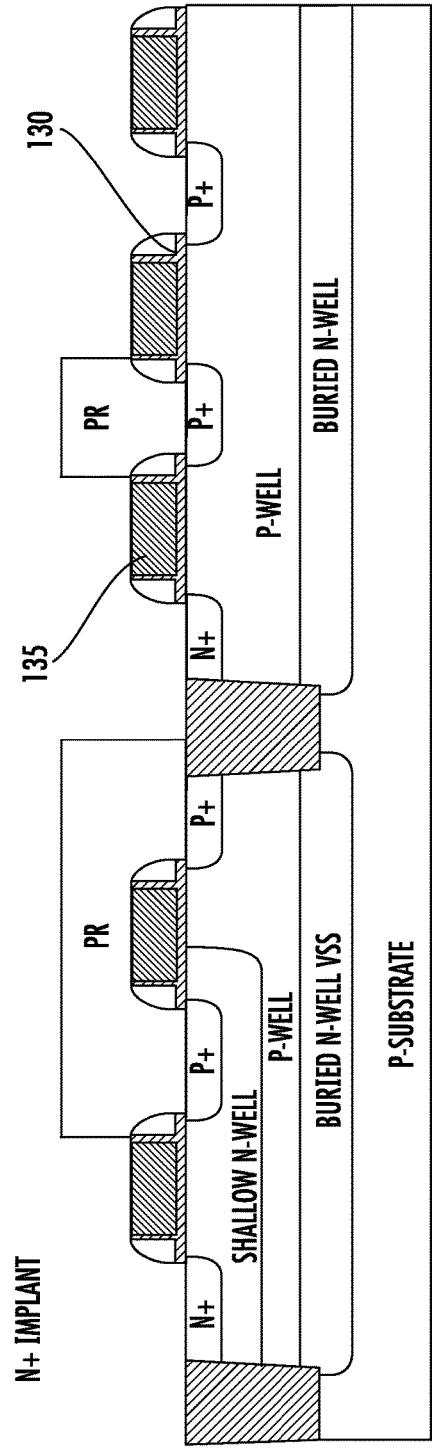
FIG. 8
FIG. 9

MTP-THYRISTOR MEMORY CELL CIRCUITS AND METHODS OF OPERATION

CROSS-REFERENCE TO RELATED APPLICATIONS

This patent application is a continuation of U.S. patent application Ser. No. 15/283,254, filed Sep. 30, 2016, issued as U.S. Pat. No. 9,761,295 on Sep. 12, 2017, which is a divisional of U.S. patent application Ser. No. 15/045,112, filed Feb. 16, 2016, issued as U.S. Pat. No. 9,484,068 on Nov. 1, 2016, which claims the benefit of U.S. Provisional Patent Application No. 62/117,275, filed Feb. 17, 2015, and which is incorporated by reference along with all other references cited in this application.

BACKGROUND OF THE INVENTION

This invention is related to integrated circuit devices having memory cell arrays and, in particular, to arrays capable of holding information without power and of being programmed multiple times.

An MTP (Multiple Times Programmable) device is a type of non-volatile memory device (NVM) that, as the name implies, can be programmed and erased numerous times. Once programmed, an MTP device can hold the programmed information even without power. Memories with MTP devices are found embedded in integrated circuits, such as microcontrollers, in many different types of computer systems, including smart phones, and independently as thumb drives which are carried on one's person and can be connected externally to a computer system (typically through a USB port).

It should be noted that often terms, such as MTP device and NVM device, are used interchangeably between the memory array, or the integrated circuit containing the array, and the memory cell, or the transistor-level element which stores programmed information. Hence care should be taken in determining what the term refers to. MTP device as used herein refers to a transistor-level element which stores programmed information unless the context clearly indicates otherwise.

At the transistor-level, an MTP device is a Field Effect Transistor (FET) device, also often referred to as a MOSFET (metal-oxide-semiconductor FET) in which the threshold voltage $V_T$ is determined by the charges in a charge storage region, such as a floating gate, or a plane or sidewall of charge trapping material in the gate region of transistor device. Nitride-based materials are examples of charge trapping materials and can form charge trapping structures, such as SONOS (Silicon-Oxide-Nitride-Oxide-Silicon layers), formed either as plane or a sidewall.

MTP memory cells face problems of scaling, i.e., problems resulting from the shrinkage in device feature size, particularly for semiconductor processes having critical dimensions of 40 nm (nanometer) or smaller. These problems include the requirements of thinner oxide layers, lower practical programming and erase voltages, smaller quantities of stored charge, and increasing variations in device parameters and performance, such as leakage and operating currents. Furthermore, Read operations should become faster with smaller features, but better access times are difficult to address in light of these problems of scaling. Furthermore, rather than a conventional NVM device in which the charge is stored in a floating gate, current MTP memory cells envision charge trapping in a sidewall of the device. This results in smaller differences in the threshold voltages between the Programmed and Erased states that must still be discriminated.

Hence what is needed is a MTP memory cell which can be easily scaled with future processes and which can solve or at least ameliorate the problems above.

BRIEF SUMMARY OF THE INVENTION

This invention provides an integrated circuit memory cell for an array of memory cells. Each memory cell in the array is capable of holding information by the storage of charge and includes a thyristor having anode and cathode regions and two intermediate regions there between; and an MTP device connected to one of the two intermediate regions of the thyristor and having a charge storage region. The charge in the charge trapping region determines the threshold voltage of the MTP device and controls the switching characteristics of the thyristor. The information held in the memory cell is determined by the switching characteristics of the thyristor.

The present invention also provides an integrated circuit structure in which a thyristor is formed in a first electrically isolated pocket of the substrate and coupled to a non-volatile memory cell in an adjacent pocket. Additionally, the integrated circuit can include a third pocket, in which a reference non-volatile memory cell having a known state of stored charge is formed. A detector may then be provided for comparing the degree of stored charge of the reference cell with charge stored in the non-volatile data memory cell.

In another embodiment the integrated circuit includes a plurality of field effect transistors providing logic functions elsewhere on the integrated circuit, the thyristor comprises at least four layers having spacing defined by field effect transistor gates that are not connected to any active potential source.

In another embodiment, an integrated circuit includes, a semiconductor substrate divided into first and second electrically isolated pockets by a region of insulating material. The first pocket includes a thyristor provided by a buried N-well, a P-well, a shallow N-well, an anode contact to a P-type region within the shallow N-well, and a cathode contact to the buried N-well. The second pocket includes a buried N-well, a P-well, spaced apart source/drain regions in the P-well, a conductive word line overlapping the spaced apart source/drain regions, a charge-trapping device having an electrode that extends between one of the source/drain regions and an additional source/drain region, and electrical contacts to each of the buried N-well, the P-well, each of the source/drain regions and the additional source/drain region. Electrical connections are provided between components in the first pocket and components in the second pocket.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIGS. 4-10 are cross-sectional views of a semiconductor structure illustrating steps of a process for forming an MTP memory cell and associated thyristor.

FIGS. 21C-1 and 21C-2 show a flow chart of the general steps of a Verify operation for a Programmed data memory cell; FIGS. 21E-1 and 21E-2 show a flow chart of the general steps of a Verify operation for an Erased data memory cell.

DETAILED DESCRIPTION OF THE INVENTION

A. MTP-Thyristor Memory Cell Circuit

Figure 1A:
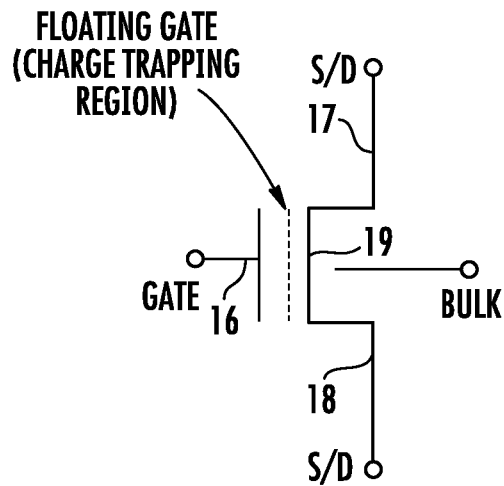
FIG. 1A is a circuit schematic of a typical MTP transistor.

In accordance with an embodiment of the present invention, an MTP transistor and a thyristor provide a memory cell. FIG. 1A shows a circuit diagram of a typical MTP transistor. As in an ordinary FET device, the MTP transistor has two source/drain regions 17 and 18 separated by a channel region over which is a conductive gate 16. The channel region is provided by the interface of a semiconductor bulk/insulator between the source/drain regions. The source/drain regions 17 and 18 are of one polarity and the semiconductor bulk 19 is of opposite polarity. The gate 16, formed by an electrode above the channel region, can be charged or discharged to allow the channel region to be conducting or non-conducting. The threshold voltage $V_T$ is the gate voltage at which current begins to flow between the source/drain regions.

An MTP transistor includes a charge storage region, typically a floating gate, or a plane or sidewall of charge trapping material in the gate region of the transistor. The dotted line in FIG. 1A is representative of a floating gate or other charge trapping region. Silicon nitride-based materials are examples of charge trapping materials and can form planar and sidewall charge trapping structures, such as SONOS (Silicon-Oxide-Nitride-Oxide-Silicon layers). The charge on the charge storage region affects the threshold voltage $V_T$ of the MTP transistor. The presence or absence of stored charge represents the data—'1' or '0' stored semi-permanently in the MTP transistor. Unless charge leaks away, the MTP transistor retains the charge, and therefore the information, until erased and reprogrammed.

Figure 1B:
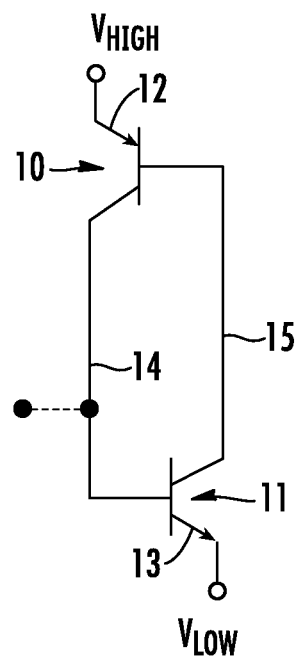
FIG. 1B is a circuit schematic of a thyristor.

As explained above, this conventional MTP transistor has drawbacks, particularly as devices become smaller and smaller. An embodiment of the present invention combines the MTP transistor with a thyristor, such as represented in FIG. 1B. A thyristor, also termed a silicon-controlled rectifier, is normally used for power applications. A thyristor is a four-layer (PNPN), three-junction device having at least two terminals, an anode and a cathode. There is typically a third terminal, called a control terminal, for switching on the currents between the anode and cathode. FIG. 1B is an electrically equivalent circuit diagram of a thyristor as represented by two bipolar transistors, a PNP transistor 10 and a NPN transistor 11, which when cross-connected as shown, are substantially electrically equivalent to a PNPN thyristor. The emitter terminal 12 of the PNP transistor 10 forms the anode, and the emitter terminal 13 of the NPN transistor 11 forms the cathode. A control terminal is shown in the drawing by a dotted line.

Figure 2:
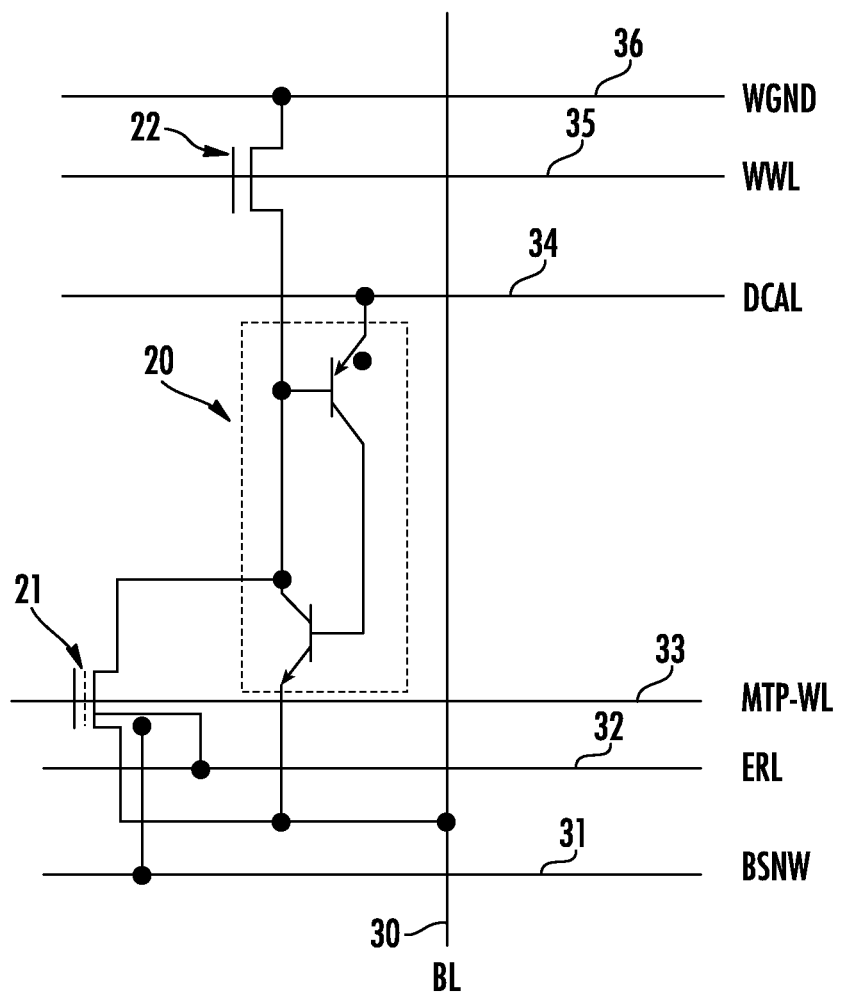
FIG. 2 is a circuit diagram of a MTP-thyristor memory cell.

In the present invention an MTP transistor is connected to a thyristor to form an MTP-thyristor memory cell. One embodiment of the present invention is shown in FIG. 2. The memory cell has a thyristor 20, a MTP transistor 21 and a second MOS transistor 22 used in programming the cell. The MTP transistor 21 is used to switch on the thyristor 20 in a memory array of such cells. Whether the MTP transistor is in a Programmed or Erased state changes the threshold voltage, $V_T$, of the MTP transistor and therefore at which gate voltage the MTP can switch on its connected thyristor. The state of an MTP-thyristor memory cell is determined by comparing the switching of the cell's thyristor against a reference memory cell having a known charge-storage state. Improved Read, Program, Erase and Verify operations are achieved.

FIG. 2 further shows the connections to an MTP-thyristor memory cell in a memory array. Conventionally terminology is that bit lines carry data, a bit of information, to and from the memory cells in an array. Word lines are used to activate the memory cells for data to be received by the cell, a Write Operation, or for data to be carried from the memory cell, a Read Operation. For a Write Operation for an MTP cell, the cell is considered 'Programmed' when charge (electrons) are placed in the charge storage region and 'Erased' when the charge is removed from, or neutralized in, the charge storage region. In this description a memory cell in a Programmed state is considered to hold a logic "1" and a memory cell in an Erased state is considered to hold a logic "0".

As shown in FIG. 2, the conducting lines to the memory cell are arranged with a bit line (BL) 30 running vertically in the drawing and word lines (or the equivalent of word lines) 33, 34 and 35 running horizontally. The thyristor 20, outlined by a dashed line, has its anode connected to the DCAL (DeCoded Anode Line) line 34 and its cathode connected to the BL line 30. The line 30 is also connected to one source/drain region of the MTP transistor 20 that is also connected to the MTP-WL (MTP-Word Line) 33. The WWL (Write-Word Line) line 35 is connected to the gate of the second MOSFET 22. The second source/drain region of the MTP transistor 20 is connected to the thyristor 20 at the base region of the PNP transistor and the collector region of the NPN transistor, and to a source/drain region of the second MOS transistor 22. The other source/drain region of the MOS transistor 22 is connected to a WGND (Write Ground) line 36. The P-doped channel region of the MTP transistor 22 is connected to an ERL (ERase Line) line 32 and a BSNW (Buried Shallow N-Well) region of the MTP transistor 22 is connected to other BSNW regions in adjacent cells to form a conducting line 31.

Figure 3:
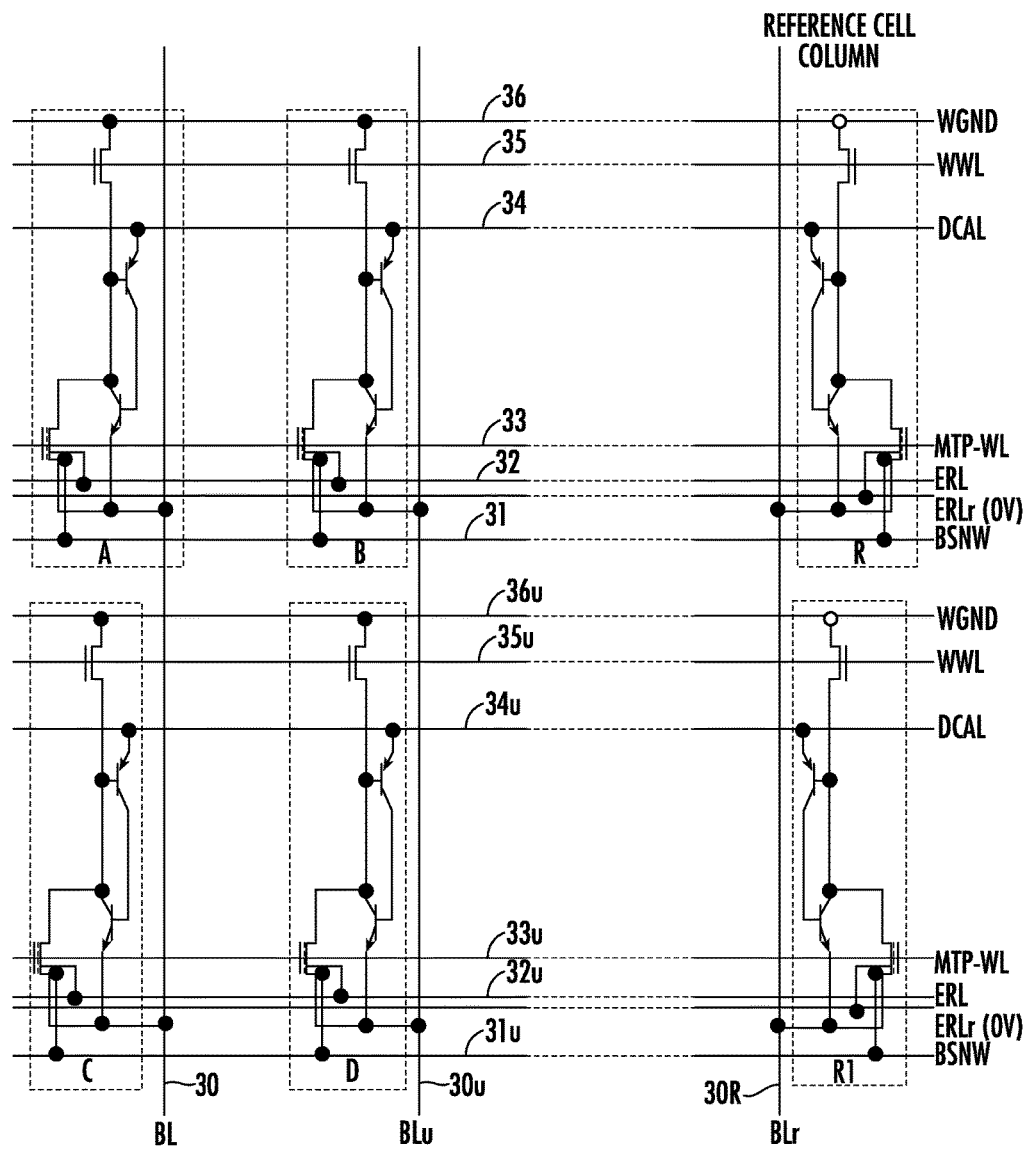
FIG. 3 is a circuit schematic illustrating how an array of MTP-thyristor memory cells is interconnected.

FIG. 3 shows how an array of MTP-thyristor memory cells might be arranged from an electrical circuit standpoint. In one memory array arrangement for every 32 or 64 memory cells commonly connected to a word line, i.e., the MTP-WL line 33, a reference cell is also included in the array. FIG. 3 is a representation of such a memory cell array with two rows and two columns of exemplary data memory cells A-D. Connected to each row of data memory cells is a reference memory cell, e.g. a reference memory cell R is connected to the MTP-WL line 33 for the data memory cells A and B, and a reference memory cell R1 is connected to MTP-WL line 33u for the data memory cells C and D. The data memory cells A and C are connected to a first bit line BL and the data memory cells B and D are connected to a second bit line BLu. The reference memory cells R and R1 are connected to a bit line BLr, ("r" for reference). In the following descriptions, the data memory cell A is considered the selected or addressed memory cell and the data memory cells B, C and D (as well as others not shown in the drawing) are the unselected memory cells. Reference memory cell R is the corresponding reference cell to the memory cell A (and B) and the reference memory cell R1 is the corresponding reference cells to the unselected memory cells C and D. The reference numerals for the second bit line and horizontal conducting lines are terminated with the suffix, u, for "unselected." Note that in this array the second MOSFETs 22 (see FIG. 2) of the reference memory cells R, R1 are not functioning and are dummies. Unlike the data memory cells, the reference memory cells are not connected to the WGND lines 36, 36u.

There are many ways to physically implement the MTP-thyristor memory cell in an array. In one embodiment of the memory cell, there is complete physical separation between the MTP device and thyristor. In a second embodiment, the MTP device and thyristor areas are separated, but share a well and bit line contact. In a third embodiment, the MTP device and thyristor are separated (there is no shared well), but the bit line contact is shared. The different implementations of the memory cell structures are based upon many factors including: how small an area the cell(s) can be packed into, the particular mechanisms used for Programming and Erasing operations, such as Fowler-Nordheim tunneling and Band-to-Band Tunneling Hot Hole Injection, and the minimization of high voltages upon the memory cell and its neighbors.

B. MTP-Thyristor Memory Cell Structures and Methods of Manufacture

The memory cells described herein can be manufactured using existing manufacturing technology. New semiconductor fabrication operations are not required, eliminating the expense and complication associated with new process development steps. FIG. 4 illustrates the starting point of a complementary metal oxide semiconductor (CMOS) process employing a P-conductivity type substrate.

FIG. 4 illustrates a semiconductor substrate in which silicon dioxide isolation regions are to be formed. The process shown in FIG. 4, as well as similar variants, is commonly referred to as shallow trench isolation, and is preferred over the previous technique, commonly referred to as local oxidation of silicon (LOCOS). In the shallow trench process a thin layer of silicon dioxide formed on the upper surface of the silicon substrate and then a layer of silicon nitride over that. Photoresist (not shown) is then used to define areas where the shallow trenches are to be formed. The combined layers of silicon oxide, silicon nitride and photoresist are illustrated as a single layer 102 in FIG. 4. At locations desired for isolation regions, trenches 104 are etched into the substrate as shown in FIG. 4. The structure is then oxidized again to form a thin layer of silicon dioxide 105 on the sidewalls of the trenches. As shown in FIG. 5, if desired, an optional P-conductivity type impurity 108 is implanted into the structure to provide buried P regions for improved isolation of the "tubs" formed between the trenches.

Next, as shown in FIG. 6, the shallow trenches are filled with insulating material 112, typically silicon dioxide. These silicon dioxide filled trenches electrically isolate regions of the semiconductor structure from each other prior to formation of transistors in the substrate. If viewed from the upper surface of the integrated circuit, these regions 112 encircle areas of the semiconductor substrate, enabling transistors or other devices to be formed in those areas which are electrically isolated from each other. Next, using ion implantation, or other well-known technology, N-conductivity type impurity is implanted into the substrate to define what will become buried N-conductivity type wells 117. Following this step, as shown in FIG. 7, P-conductivity type impurity is implanted, or otherwise introduced into the substrate to form P-wells 121.

As next shown by FIG. 8, another masking operation is performed to expose the substrate and the locations where shallow N-conductivity type wells are desired. (The use of these wells is discussed below.) An N-type implant is then performed to create shallow N-wells 126 wherever desired in the semiconductor substrate.

FIG. 9 illustrates the next steps in the process. A thin layer of silicon dioxide 130 is formed over the substrate, typically by thermal oxidation of the underlying silicon. Then a layer of polycrystalline silicon 135 is deposited across the surface of the semiconductor structure on top of the gate oxide 130. This layer will ultimately become the gates of the complementary MOS transistors for logic circuits formed on the semiconductor substrate.

Figure 10:
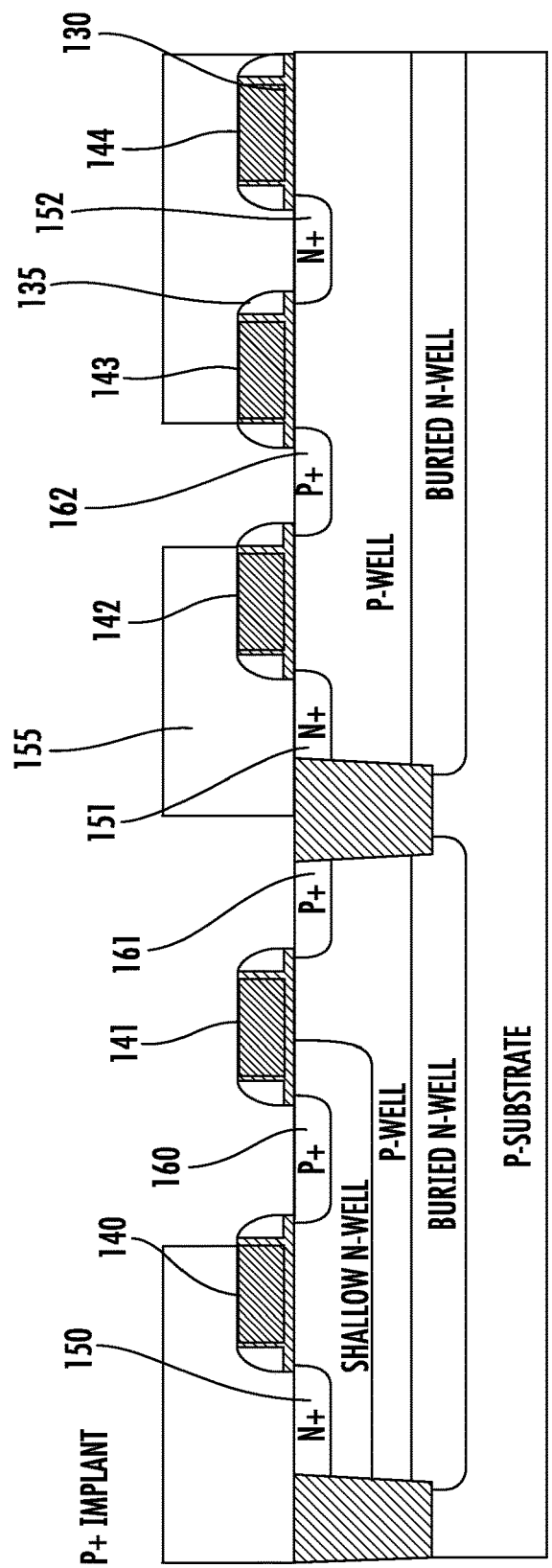

Using another masking operation (not shown), the polysilicon layer 135 and the gate oxide layer 130 are etched to remove them from the structure where the CMOS sources and drains, and bipolar emitters and collectors, are to be formed. In FIG. 10, five such gates 140, 141, 142, 143 and 144 are illustrated. As will be discussed below, however, some of these field effect transistor gates are not used as gates, instead serving to mask the substrate from subsequent impurity doping steps to provide self-aligned doped regions in the substrate. The use of these 'dummy' gates enables the integrated circuit structures, including the layers of the thyristor described here, to be manufactured with CMOS process technology, such as typically is used to fabricate logic circuits elsewhere on the same semiconductor substrate. Once the gate regions are defined, subsequent process steps result in oxidation of the sidewalls of the polysilicon, creating the 'domed' appearance of the gates shown in the figure.

After formation of the gates 140 . . . 144, the structure is again masked and N-conductivity type impurity is introduced to form field-effect transistor sources and drains, and bipolar layers of the thyristor. Three such regions 150, 151 and 152 are shown in FIG. 10. Then another similar masking operation, photoresist is deposited and removed everywhere except where P-conductivity type dopant is to be introduced, again to form field-effect transistor sources and drains, and bipolar layers of the thyristor. FIG. 10 illustrates the photoresist 155 for this P-dopant step, as well as the resulting doped regions 160, 161, and 162. The function of each of the regions 150, 151, 152, 160, 161 and 162 will be described below. In addition, as also discussed below, the doped regions can be arranged differently depending upon the functions desired for the semiconductor structure. Subsequent to the doping of the various sources, drains, emitters and collectors, metal or polysilicon electrical connections are provided to those electrodes using well-known semiconductor fabrication techniques.

Figure 11:
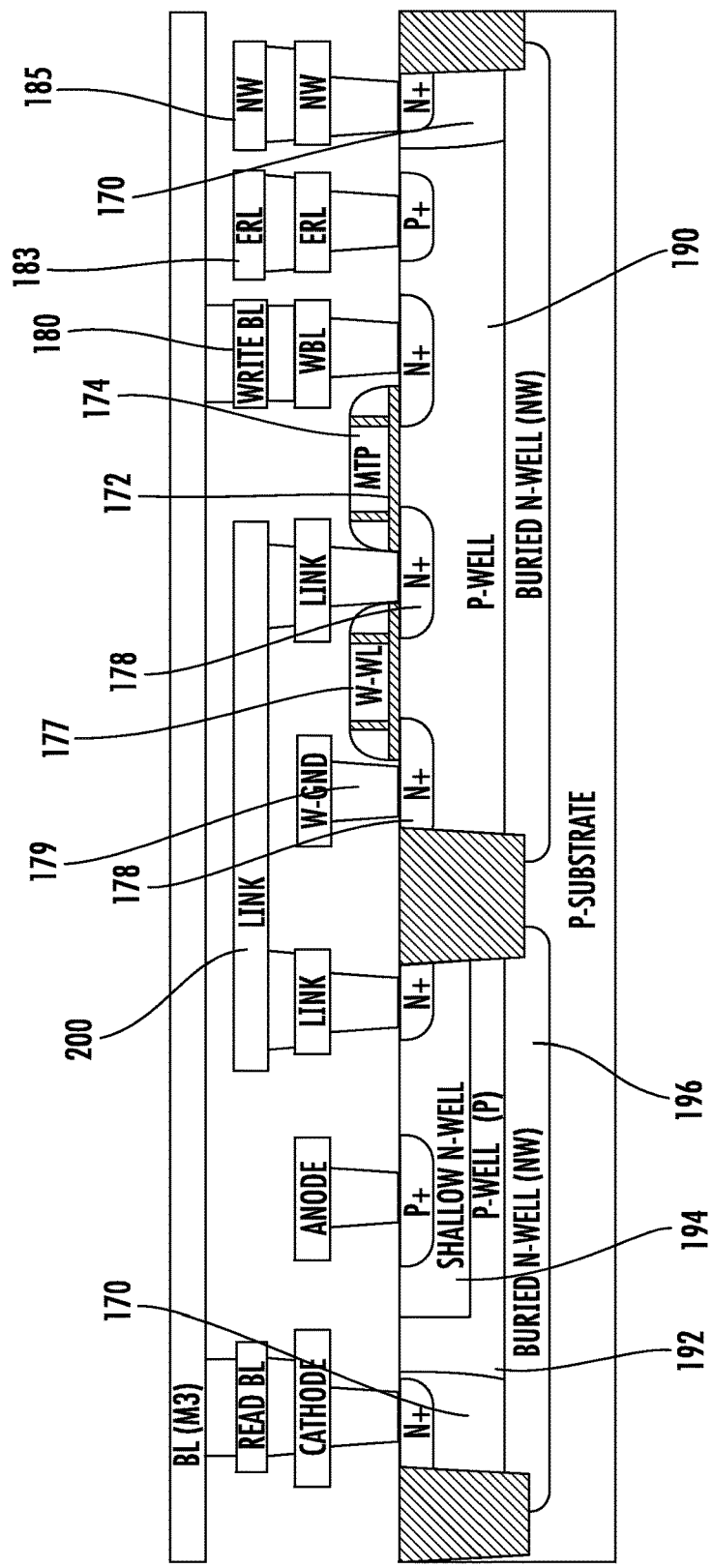
FIG. 11 is a cross-sectional view illustrating an embodiment of a thyristor-based MTP memory cell in which Fowler-Nordheim tunneling is used.

FIG. 11 is a cross-sectional view of a semiconductor structure that provides a thyristor-based non-volatile memory cell. The illustrated structure is fabricated using the processes just described above. Note, however, that an additional implantation step is used to provide N-type electrical connections 170 to the buried N-wells, and that the P+ and N+ doped regions at the surface of the substrate are rearranged from those depicted in FIG. 10.

The right hand portion of the illustrated structure provides the memory cell which operates using Fowler-Nordheim tunneling, while the left hand portion provides a thyristor connected to word and bit lines for accessing the memory cell to read data from it. (A circuit schematic of the cell and thyristor are described above with respect to FIGS. 1 and 2.) Fowler-Nordheim tunneling is the process in which electrons tunnel through a barrier in the presence of a high electric field, i.e. the electrons are able to tunnel from the source/drain regions on to a floating gate, sidewall, silicon nitride region, or other desired location 172.

Also illustrated in FIG. 11 are electrical connections to the various electrodes. These connections provide: a bit line (BL), a word line for the MTP device (174), cathode and anode connections to the thyristor, a line (W-WL) for enabling the gate that passes the programming current to ground from the memory cell, a ground (W-GND) for the MTP programming current, an erase line (ERL), and a connection (NW) to the buried N-well under the memory cell.

In FIG. 11 and the other cross-sectional views of FIGS. 13-16, conductive regions that are labeled with a name in underlined italics, e.g. "*Anode*", are conductive regions that extend into and/or out of the page to other nearby semiconductor structures. Conductive regions that are not in italics and not underlined, e.g. "Cathode" are connections only to the structure depicted in the cross-section in that figure.

The memory cell operates by trapping charge in a silicon nitride layer 172 under (or adjacent to) a polysilicon gate 174. Charge can be trapped in, or removed from, the silicon nitride layer by application of appropriate potentials to the various electrodes of the structure illustrated. The presence or absence of trapped charge provides the state of the memory cell, i.e. as a '0' or a '1'. As mentioned above, the presence or absence of trapped charge is determined by application of appropriate potentials to various electrodes of the illustrated structure and a comparison of the response of the memory cell to a reference cell in a known state. Herein we use the term "memory cell" to refer to the semiconductor structure, and the terms "data cell" and "reference cell" to refer to the functionality of a particular memory cell. In one embodiment the layer 172 consists of a stack of three layers—silicon dioxide, silicon nitride and silicon dioxide, often termed 'SONOS'. In another embodiment the charge is trapped in a silicon nitride sidewall of such a structure. Either structure can be fabricated using well-known semiconductor technology.

A series of non-functional field effect transistor gates, i.e. gates which are not connected to any active potential source, but which are used to provide appropriate spacing between adjoining doped regions, are not shown in FIG. 11. These 'dummy' gates would be present between the doped regions at the surface of the substrate, i.e. between the cathode and the anode, between the anode and the link in the thyristor side, between write bit line and the erase line, and between the erase line and the connection to the buried N-well. These dummy gates are shown in the top view of the structure (FIG. 12) discussed below.

Table 1 below sets forth the potentials applied to the various electrodes of the structure shown in FIG. 11 for various operations. All values are given in volts. This and the tables below are most easily understood with reference to FIG. 3. In FIG. 3 assume that it is cell A that is to be read or programmed. Cell B is an inactive cell in the same row as cell A. Cell C is an inactive cell in the same column as cell A. Cell D is an inactive cell not in either the same column or row as cell A. The first row of the table below shows the potentials applied to the various electrodes of the semiconductor structure to read cell A and inhibit cell C. The second row shows the conditions for reading cell A and inhibiting cells B and D. The third row shows potentials for programming cell A, and the next three rows show the potentials for inhibiting programming of cells B, C, and D. The next two rows of the table show the potentials for erasing cells A and B and inhibiting erasing of cells C and D. The last row shows the potentials for assuring the state of the reference cells is not changed during an erase operation.

TABLE 1

Exemplary Voltages for an Embodiment of FIG. 11

| Mode | BL | Anode | MTP-WL | W-WL | W-GND | ERL | NW |
|---|---|---|---|---|---|---|---|
| Read/inhibit C | 0/0 | 1.4/0 | Ramp 0.8/0 | 0 | 0 | 0 | 0 |
| Read - inhibit B/D | VDD-0.7 | 1.4/0 | Ramp 0.8/0 | 0 | 0 | 0 | 0 |
| Program - A | 3 | 0 | 5 | +2.5 | 0 | 0 | 0 |
| Program - inhibit B | 0 | 0 | 5 | +2.5 | 0 | 0 | 0 |

TABLE 1-continued

Exemplary Voltages for an Embodiment of FIG. 11

| Mode | BL | Anode | MTP-WL | W-WL | W-GND | ERL | NW |
|---|---|---|---|---|---|---|---|
| Program - inhibit C | 3 | 0 | 0 | 0 | 0 | 0 | 0 |
| Program - inhibit D | 0 | 0 | 0 | 0 | 0 | 0 | 0 |
| Erase A/B | 5 | 2.5 | −5 | 2.5 | 5 | 5 | 5 |
| Erase inhibit C/D | 5 | 2.5 | 0 | 2.5 | 2.5 | 2.5 | 2.5 |
| Erase - maintain reference AB/CD | VDD | 2.5/2.5 | −5/0 | 2.5/2.5 | FL/FL | 0 (wired) | 0 (wired) |

The structure described in FIG. 11 links an MTP memory cell to a local thyristor achieving benefits particularly desirable in the context of highly scaled memory devices, such as those fabricated with 28 nm design rules and below. The data cell operates by using the MTP device to switch on the thyristor at a word line voltage approximately equal to the threshold voltage of the MTP device. The threshold voltage will be higher or lower than a reference cell depending on whether the data cell is in an erased or a programmed state. In particular, the structure illustrated overcomes issues associated with the prior art limitations on memory cells including the prior art need for thinner oxides, lower program and erase potentials, and smaller quantities of stored charge. The design presented also reduces the variations in device performance associated with increasing smaller design rules of the prior art.

Conventional sidewall charge storage based memory devices encounter a further challenge. In such devices the charge trapped in the sidewall has a limited influence on the FET channel primarily due to the geometrical position of the charge relative to the channel. This results in a small difference in threshold voltage values between the programmed and erased states. A further difficulty is maintaining a fast read speed, because of the limited signal difference between the reference cell and the programmed or erased data cell. The thyristor described here overcomes this difficulty with its ability to discriminate between the smaller different threshold voltages, yet maintain a fast read speed.

If data cell is in the erased state, a lower threshold voltage than that of the reference cell, the data cell thyristor will switch ahead of (before) the reference cell thyristor when the MTP word line voltage is ramped with an increasing voltage. On the other hand, if the data cell is the programmed state, the reference cell thyristor will switch ahead of the data cell thyristor for the same increasing word line voltage ramp. A sense amplifier detects which of the data cell or reference cell switched first, thereby indicating the '1' or '0' state of the data cell. In a preferred embodiment there is one reference cell for every 32 or 64 data cells.

Referring again to FIG. 11, the memory cell charge-trapping device 172 has one field effect transistor comprises gate 177 and source/drain 178 for connecting the memory cell to a ground path (W-GND) 179. A bit line 180 used when writing data to the memory cell and reading from the memory cell is coupled to a source/drain electrode adjacent the charge-trapping device. An erase connection 183 enables application of appropriate potentials to remove trapped charge from the memory cell. Erasing of the cell is by Fowler-Nordheim tunneling. An electrical connection 185 enables application of appropriate potentials to the buried N-well.

As mentioned above, FIG. 11 illustrates a data cell. A reference cell for a group of data cells is fabricated at the same time nearby on the semiconductor substrate using the same process steps, however, the connection 179 between the 'W-GND' line and region 178 is not present. Instead the W-GND line passes over the reference cell without being connected to region 178. In addition, the ERL line 183 and S-NW line 185 are connected to a bit line hard wired to ground. Further explanation of a reference cell is provided below.

In one embodiment of the memory cell, the P-well 190 in the memory cell is isolated from adjacent cells and is driven to +5 v for erase and −2 v for programming. The buried N-well beneath the memory cell can be provided on a per cell basis, as illustrated in FIG. 11, or shared among a group of cells, for example by forming the buried N-well implant to extend under the trench isolation to adjoining cells.

Each thyristor includes an isolated shallow P-type well 192, an isolated shallow N-type well 194, and a buried N-type well 196. The 'link' connection 200 between the thyristor and the memory cell experiences higher voltages during programming operations. Therefore the thyristor junctions are appropriately designed to withstand these higher voltages.

Further benefits of the illustrated structure include the following. Use of the thyristor makes reading the data cells appear as a threshold voltage measurement. The thyristor allows a high bit line current once the MTP word line voltage exceeds the threshold voltage of the memory cell. Our work to date suggests a 25-30% bit line speed advantage compared to use of just field effect devices in lieu of the thyristor. Our work to date also suggests that the thyristor-based approach in conjunction with a differential amplifier can discriminate a 50-millivolt difference in threshold voltage between a data cell and a reference cell. Furthermore reduced program and erase times are facilitated by the reduced need to shift the threshold voltage as much as in prior art devices. The ability to discriminate between smaller differences in threshold voltage also provides improved data retention. In addition, electric fields internal to the cell are low resulting in lower "on-the-shelf" charge loss. A yet further benefit is the advantage that due to the need for the difference in threshold voltage between the reference cell and the programmed or erased cell being relatively smaller than prior art devices, the bit-cell may be programmed or erased at a lower voltage than prior art device without increasing program or erase time. This is a significant advantage for advanced process nodes (e.g. 28 nm processes and smaller) that generally have a lower voltage limit than older processes. Alternatively, if the invention is implemented utilizing an older process that supports higher voltage, the programming or erase voltage may be maintained at a relatively higher level (as may be used in a prior art device) but gives the benefit of a faster program or erase time than a prior art device.

Figure 12:
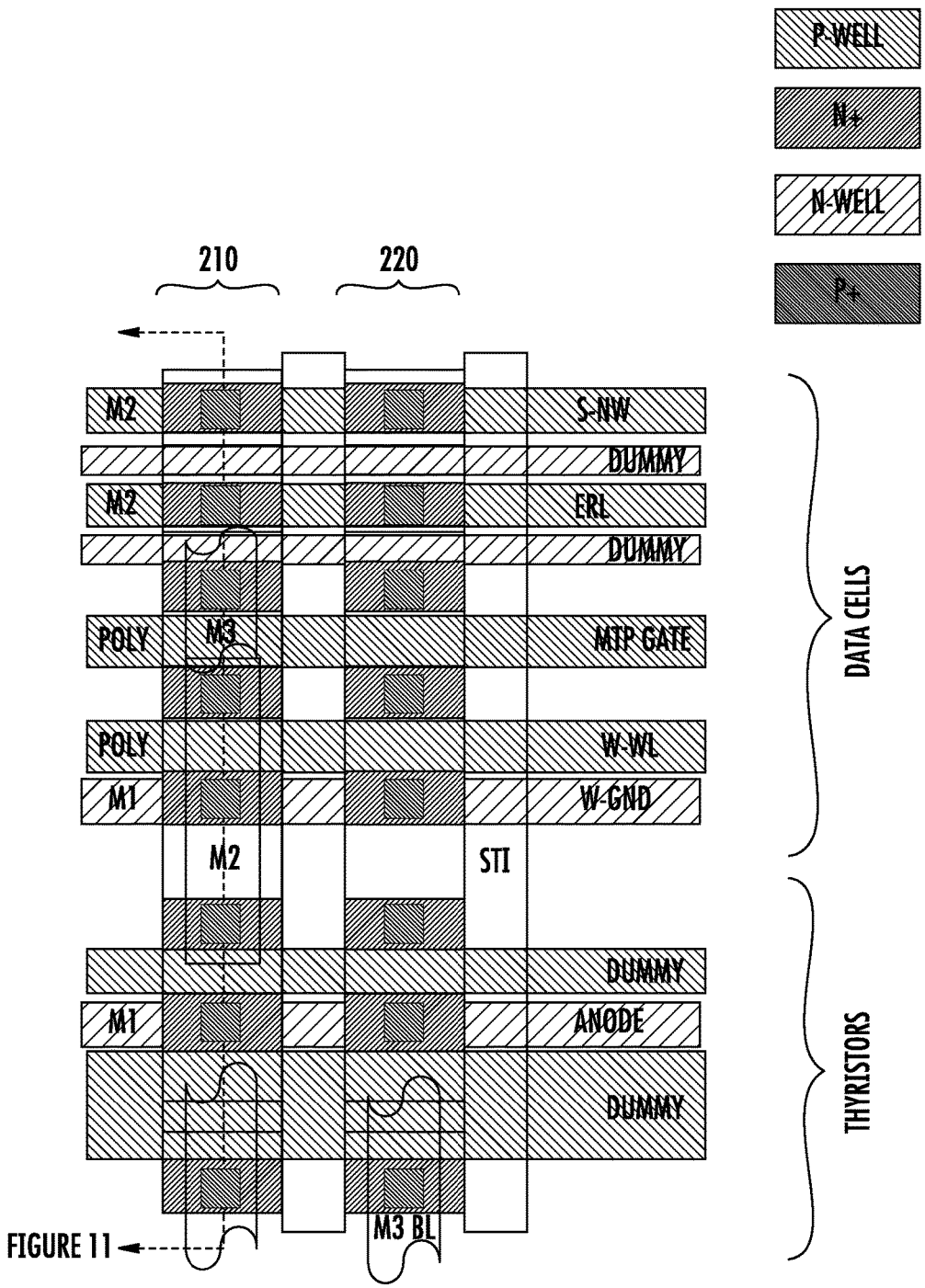
FIG. 12 is a top view of the structure shown in FIG. 11. Two adjacent memory cells are shown.

FIG. 12 is a top view of the structure shown in cross-section in FIG. 11, however, two adjacent data cells 210 and 220 are illustrated. A dashed line also illustrates the location of the cross-sectional view of FIG. 11. The references in FIGS. 11 and 12 to M1, M2 and M3 are to metal interconnection layers 1, 2 and 3.

Figure 13:
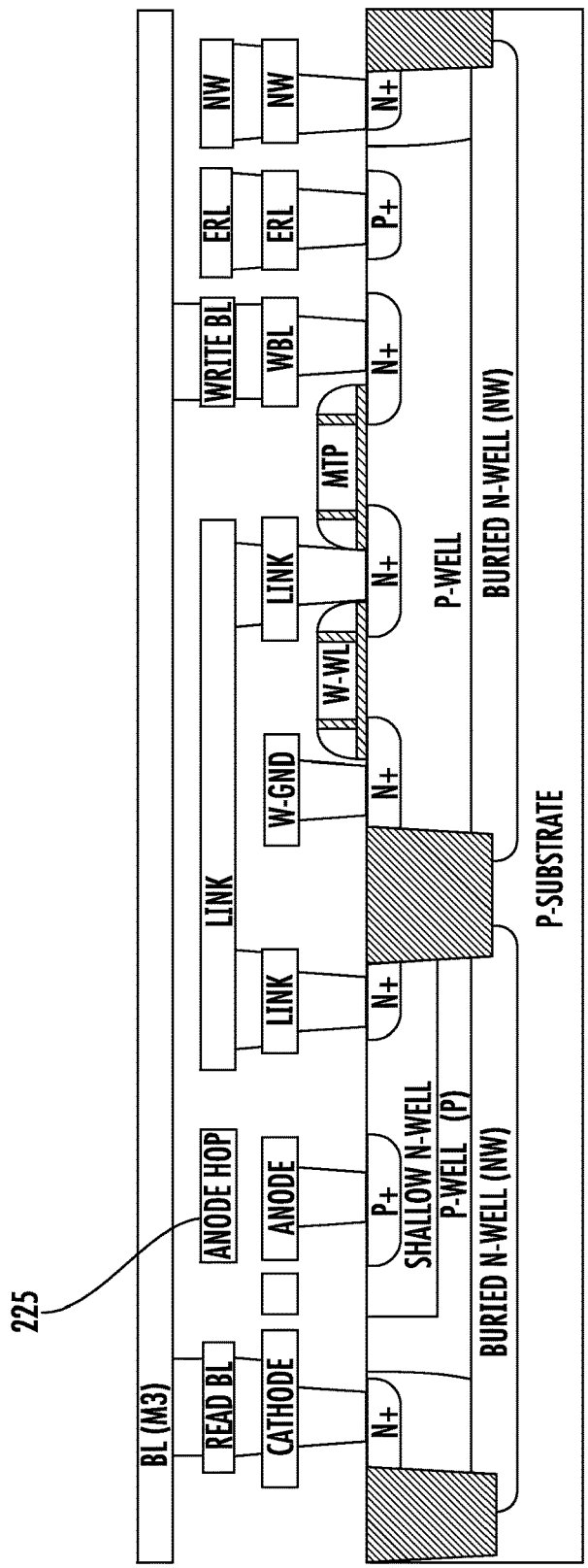
FIG. 13 is a cross-sectional view illustrating an embodiment of a thyristor-based non-volatile memory cell in which band-to-band-tunneling hot hole injection is used.

FIG. 13 is a cross-sectional view of an embodiment in which band-to-band-tunneling hot hole injection is used to erase the data cell. This technique, also known as hot hole injection, has positive (hole) charge locally injected above the drain junction of the memory cell. Hot hole injection operates with lower voltages compared to F-N tunneling. Hot hole injection is a phenomenon in semiconductor devices in which a hole (absence of an electron) gains enough kinetic energy to overcome a potential barrier necessary to break an interface state and thus 'jump' to a nearby part of the semiconductor device. 'Hot' refers to the effective energy used to model carrier density, not to the overall temperature of the device. When the charge carriers become trapped, for example, in the gate dielectric of a MOS transistor, the switching characteristics of the transistor are changed.

Figure 19:
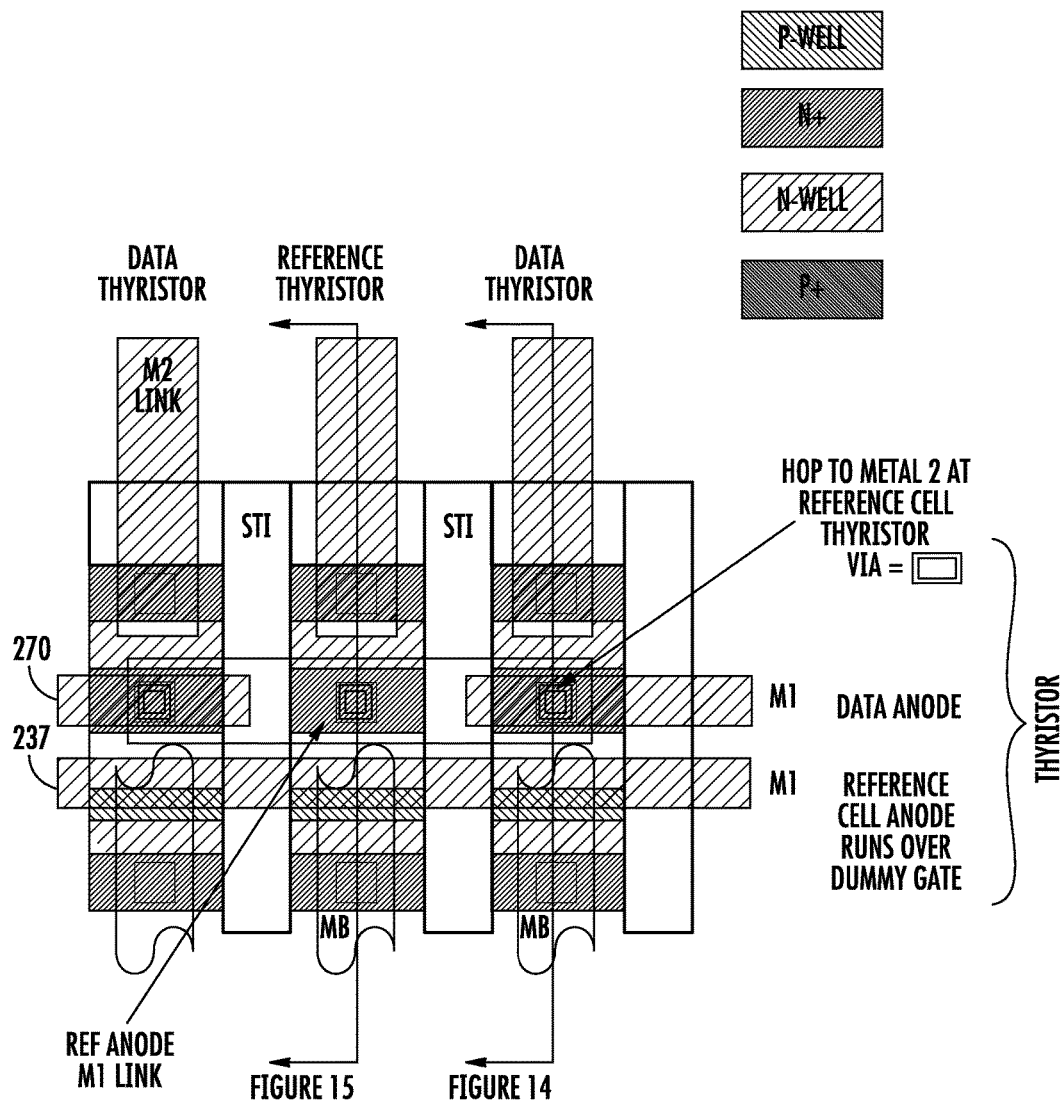
FIG. 19 is a more detailed top view of some of the semiconductor structure shown in FIGS. 14, 15 and 16.

The structural difference between this embodiment and the embodiment of FIG. 11 is the presence of an anode hop connection 225 that connects to the anodes of the data cells where that metal line crosses a reference cell. 'Anode hop' line facilitates separate connections to the data cell thyristor anode and the reference cell thyristor anode for reducing voltage disturbs at the reference cell. (Further depiction is shown in FIG. 19.) The additional anode line 237 for the reference cell is included. Table 2 below sets forth the potentials applied to the various electrodes of the structure shown in FIG. 13 for different operations, again using the cell array of FIG. 3. All values are given in volts.

structure. In this embodiment the erase function is shared by two adjacent rows of data cells. This embodiment also relies upon band-to-band-tunneling hot hole injection to erase the data cell.

Figure 14:
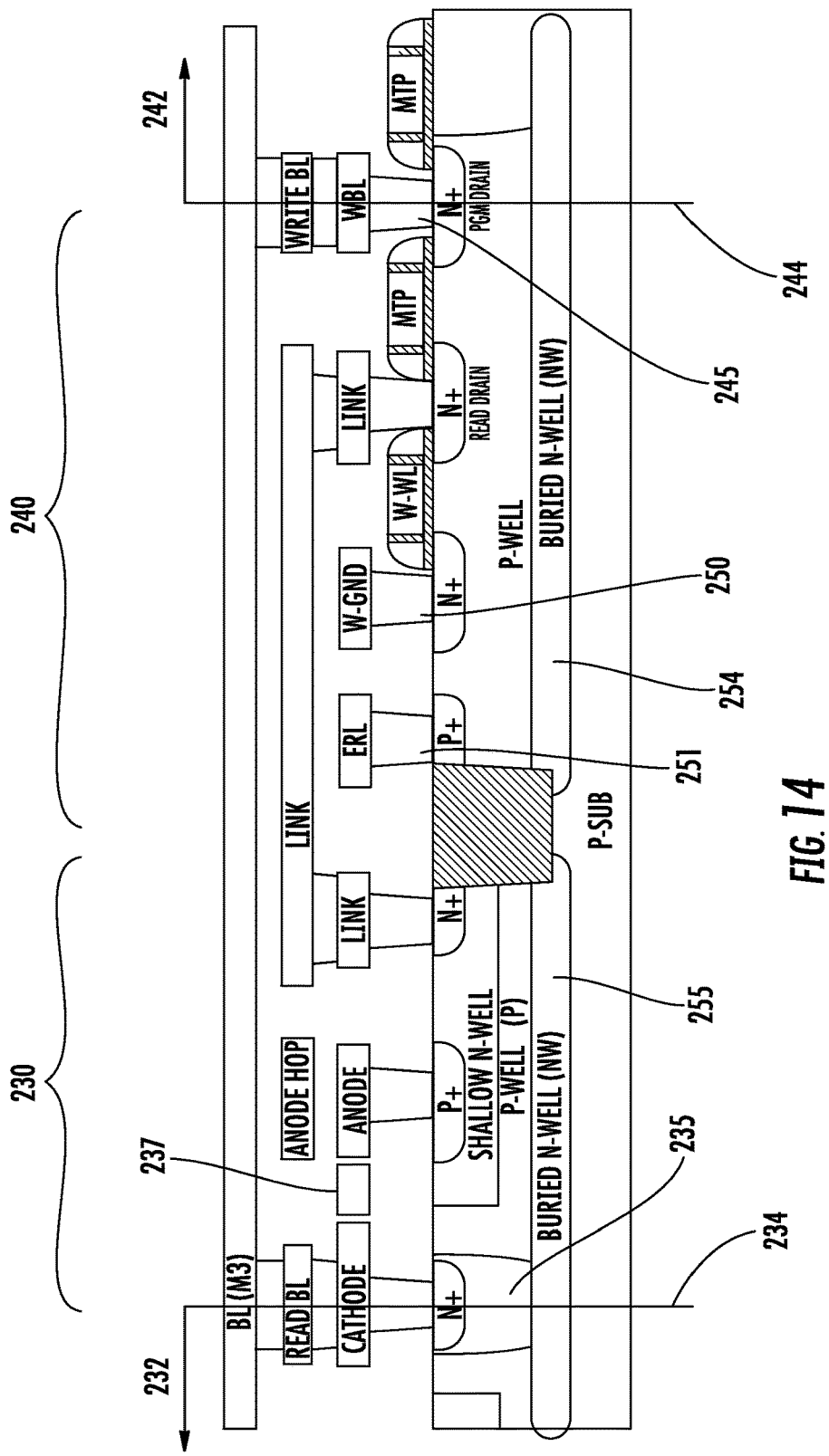
FIG. 14 is a cross-sectional view illustrating a data cell and thyristor in which band-to-band-tunneling hot hole injection is used, and two adjacent rows of memory cells share a common write bit line.

The thyristor portion 230 of the structure shown in FIG. 14 is almost the same as in FIG. 12, and its operation is not discussed again here. The thyristor portion of the structure, however, is repeated in region 232 (not shown), being symmetrically reflected about axis 234. This allows one contact 235 to the buried N-well to be shared between the thyristors in regions 230 and 232. The arrangement of data cells and reference cells requires an additional anode conductor 237 to enable connection to the reference cell anode. This aspect of the structure is best understood with reference to a top view discussed later below.

The data cell in region 240 is also the same in structure as described above. The data cell of region 240 is also repeated in region 242, being symmetrically reflected about axis 244. This allows one write bit line to be shared by the data cells in regions 240 and 242. The data cell includes a connection 250 from the W-GND line to the N+ doped region and a connection 251 between the erase line ERL and the P-well. These connections are not provided to the reference cells, as discussed below. The buried N-well 254 is shared by all cells (data and reference) in the same row, while the buried N-well 255 is unique to each individual thyristor.

Table 3 below sets forth the potentials applied to the various electrodes of the structure shown in FIG. 14 for

TABLE 2

Exemplary Voltages for an Embodiment of FIG. 13

| Mode | BL | Anode | MTP-WL | W-WL | W-GND | ERL | NW |
|---|---|---|---|---|---|---|---|
| Read/inhibit C | 0/0 | 1.4/0 | Ramp 0.8/0 | 0 | 0 | 0 | 0 |
| Read - inhibit B/D | 0.7 | 1.4/0 | Ramp 0.8/0 | 0 | 0 | 0 | 0 |
| Program - A | 3 | 0 | 5 | 2.5 | 0 | −2.0 | 0 |
| Program - inhibit B | 0 | 0 | 5 | 2.5 | 0 | −2.0 | 0 |
| Program - inhibit C | 3 | 0 | 0 | 0 | 0 | 0 | 0 |
| Program - inhibit D | 0 | 0 | 0 | 0 | 0 | 0 | 0 |
| Erase A/B | 5 | 2.5 | −5 | 0 | 2.5 | 0 | 2.5 |
| Erase inhibit C/D | 5 | 2.5 | 0 | 2.5 | 2.5 | 2.5 | 2.5 |
| Erase - maintain reference AB/CD | 0 | 0/0 | −5/0 | 0/2.5 | FL/FL | 0 (wired) | 0 (wired) |

FIG. 14 is a cross-sectional view illustrating a third embodiment of the memory cell—thyristor semiconductor different operations, again using the cell array of FIG. 3. All values are given in volts.

TABLE 3

Exemplary Voltages for an Embodiment of FIG. 14

| Mode | BL | Anode | MTP-WL | W-WL | W-GND | ERL | NW |
|---|---|---|---|---|---|---|---|
| Read/inhibit C | 0/0 | 1.4/0 | Ramp 0.8/0 | 0 | 0 | 0 | 0 |
| Read - inhibit B/D | 0.7 | 1.4/0 | Ramp 0.8/0 | 0 | 0 | 0 | 0 |
| Program - A | 3 | 0 | 5 | 2.5 | 0 | −2.0 | 0 |

TABLE 3-continued

Exemplary Voltages for an Embodiment of FIG. 14

| Mode | BL | Anode | MTP-WL | W-WL | W-GND | ERL | NW |
|---|---|---|---|---|---|---|---|
| Program - inhibit B | 0 | 0 | 5 | 2.5 | 0 | −2.0 | 0 |
| Program - inhibit C | 3 | 0 | 0 | 0 | 0 | −2.0 | 0 |
| Program - inhibit D | 0 | 0 | 0 | 0 | 0 | −2.0 | 0 |
| Erase A/B | 5 | 2.5 | −5 | 2.5 | 2.5 | 0 | 2.5 |
| Erase inhibit C/D | 5 | 2.5 | 0 | 2.5 | 2.5 | 2.5 | 2.5 |
| Erase - maintain reference AB/CD | 0 | 0/0 | −5/0 | 2.5/2.5 | FL/FL | 0 (wired) | 2.5 |

Figure 15:
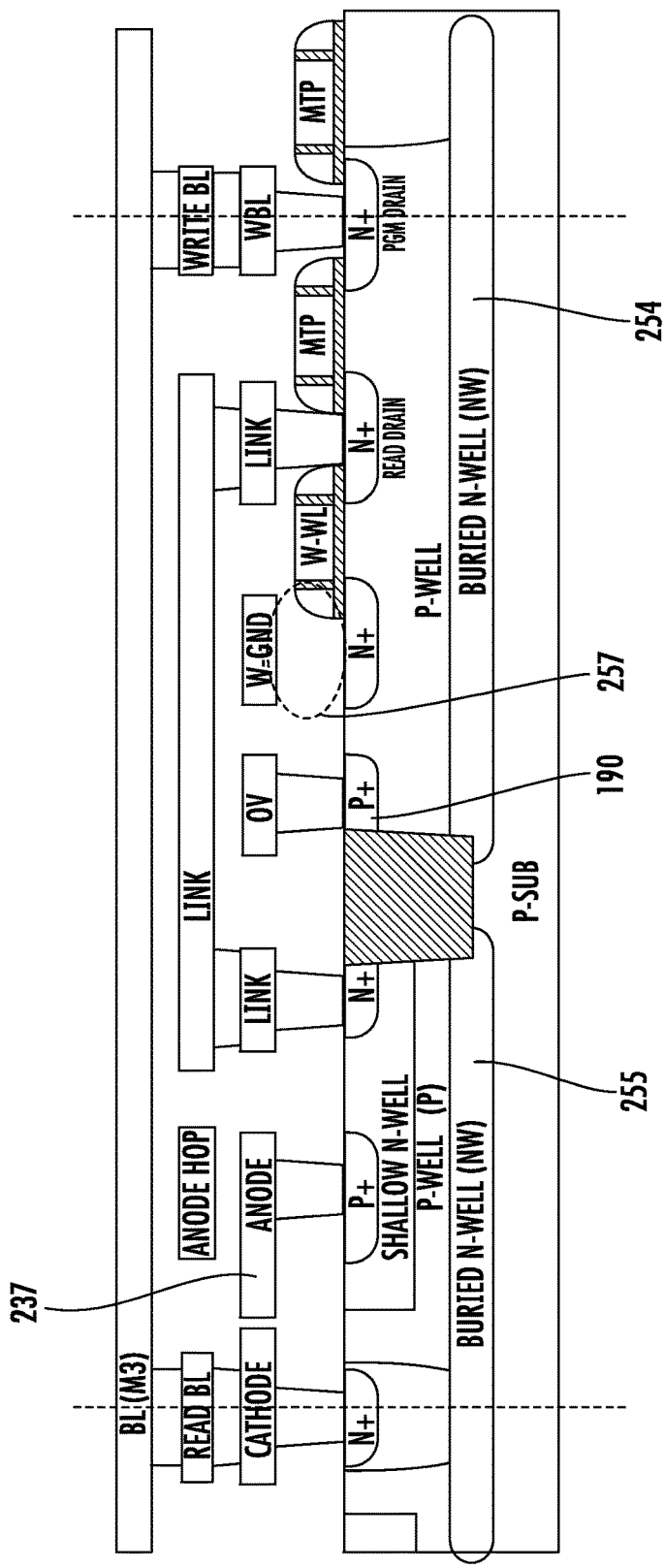
FIG. 15 is a cross-sectional view illustrating a reference cell in the embodiment of FIG. 14.

FIG. 15 illustrates a cross section of the semiconductor device where a reference cell is located. Typically, a reference cell is placed every 32 or 64 data cells depending upon the particular characteristics of the semiconductor device and its desired performance. The reference cell is the same as a data cell, except instead of a contact to the erase line ERL, the P-well 190 is hard wired to ground potential as shown in the figure. Also note that the anode electrode line 237, which in FIG. 14 was not connected to the data cell anode, is now connected to the thyristor anode in the reference cell. In addition, connection 250 (FIG. 14) is not provided to the W-GND line, as indicated by oval 257. This prevents disturbing the reference cell when the associated data cells are erased. Finally, as in FIG. 14, the reference cell buried layer 254 is shared among all data and reference cells in that row, while buried layer 255 is unique to each cell.

Figure 16:
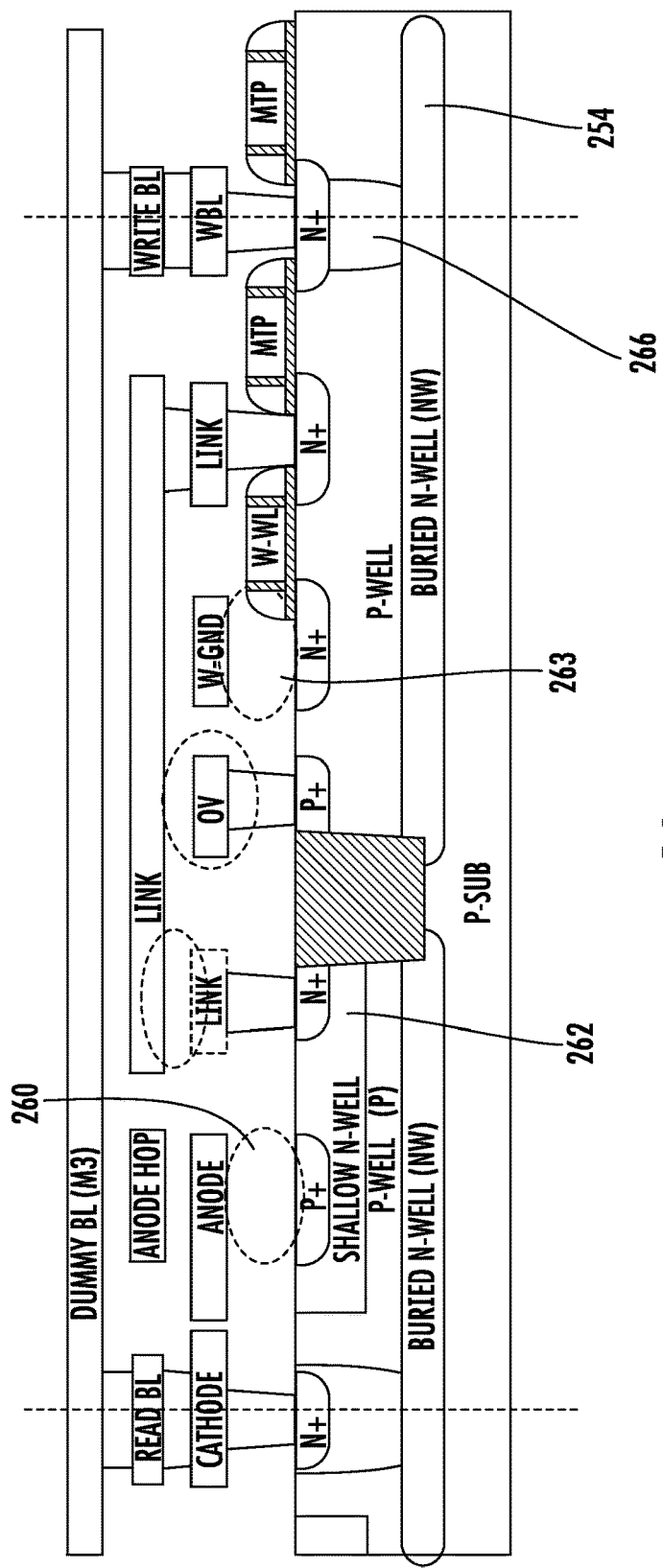
FIG. 16 is a cross-sectional view illustrating a dummy cell in the embodiment of FIG. 14.

FIG. 16 illustrates a cross section of a 'dummy' cell. A dummy cell is placed adjacent each reference cell, e.g. every 32 or 64 data cells. The purpose of the dummy cell is to provide the appropriate potential for the data and reference cell N-well 254. The dummy cell differs from a reference cell by eliminating connection 260 to the anode of the thyristor, eliminating connection 262 to the shallow n-well of the thyristor, and eliminating connection 263 to the W-GND line. Finally a connection 266 is provided between the dummy cell write bit line and the dummy cell buried N-well 254. This connection passes the dummy bit line potential to the buried N-well 254 providing the buried N-well potential for all data cells and reference cells in that row.

Figure 17:
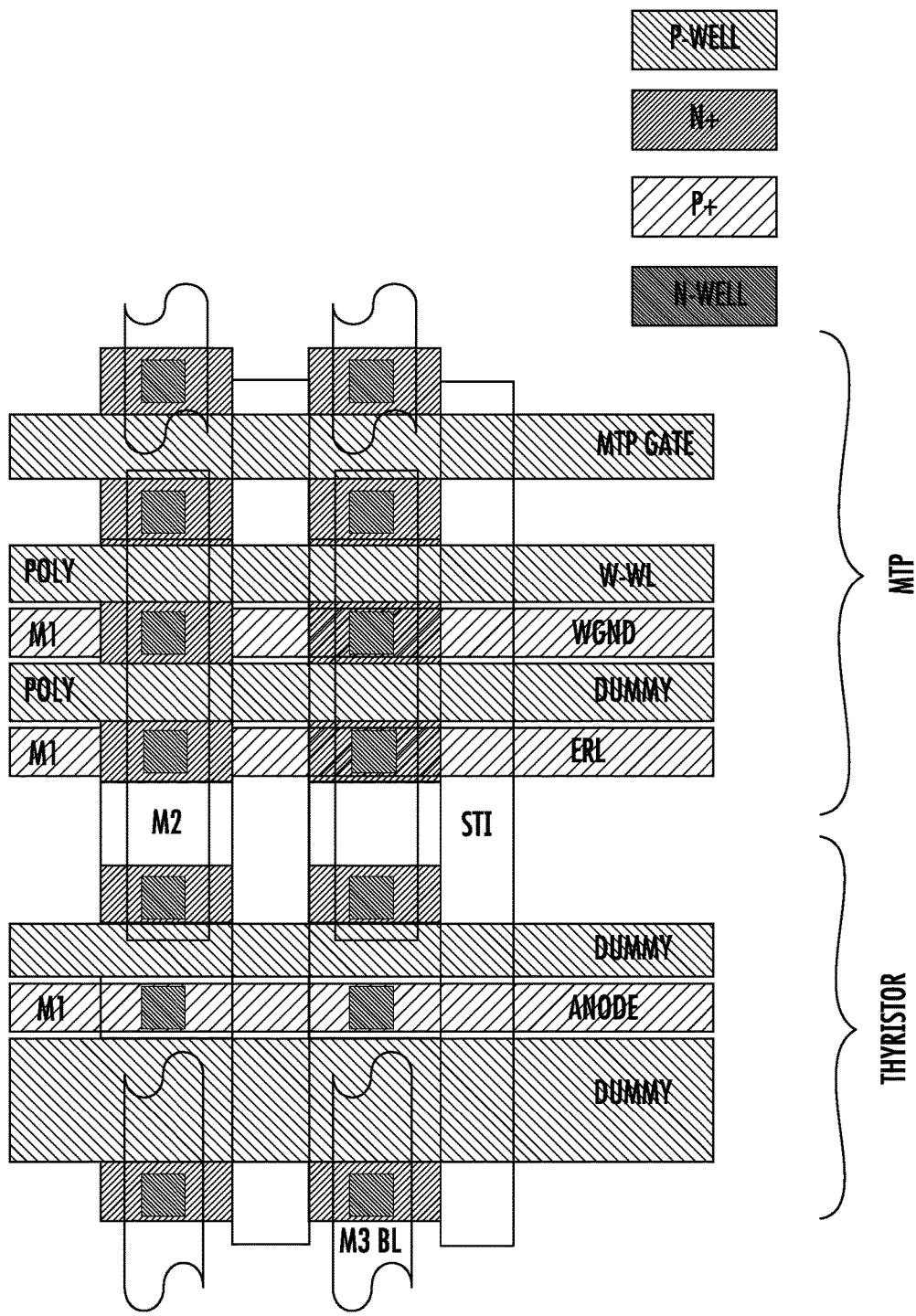
FIG. 17 is a top view of some of the structure of FIG. 16. Two adjacent memory cells are shown.

FIG. 17 is a diagram illustrating a top view of the semiconductor structure shown in FIGS. 14-16. Two adjacent data cells are illustrated. The rectangular arrangement conserves surface area on the integrated circuit.

Figure 18:
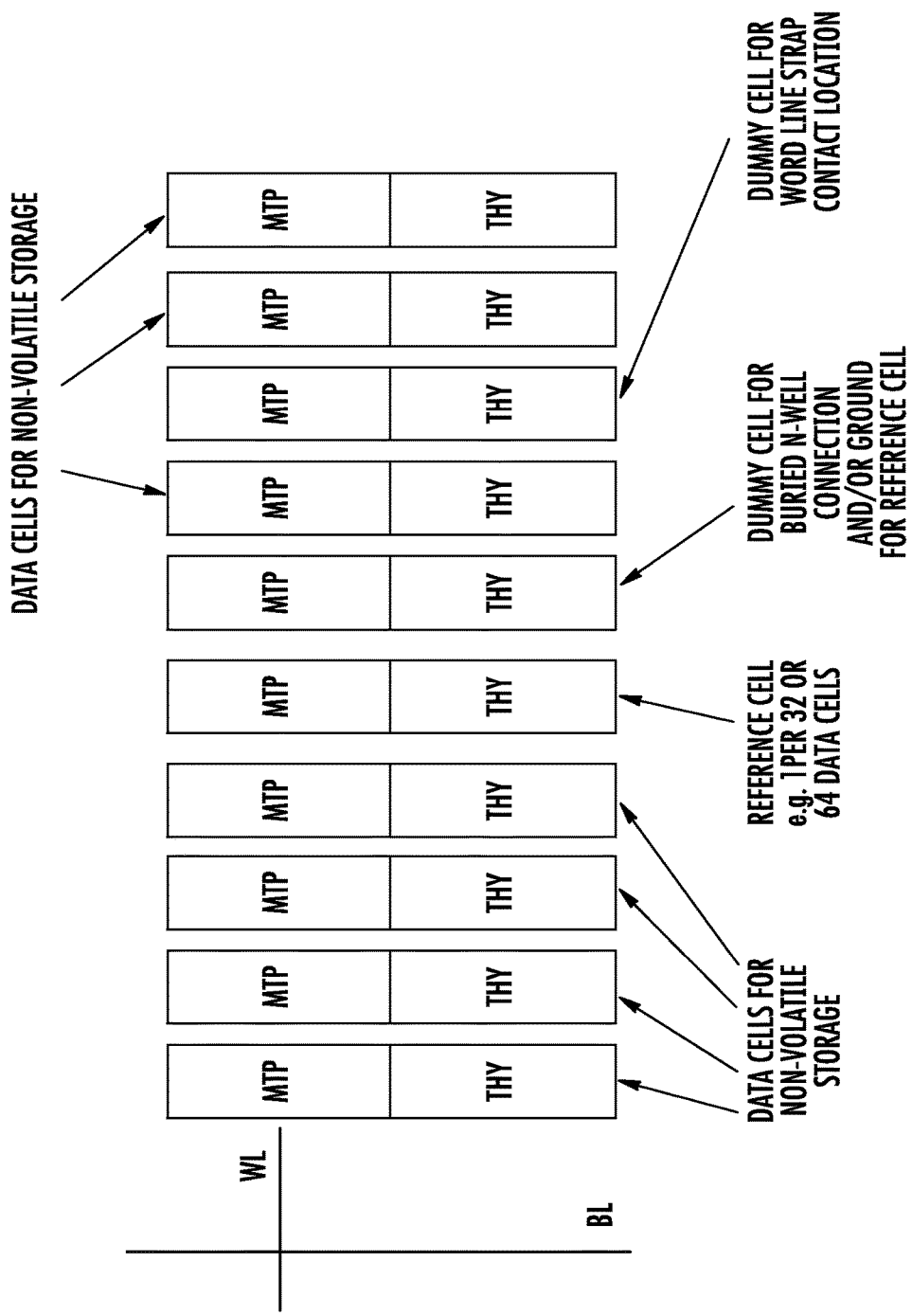
FIG. 18 is a diagram illustrating a small portion of the layout of memory cells of FIGS. 14, 15 and 16.

FIG. 18 is a diagram illustrating an example of a layout architecture of a small section of a row of memory cells. A 1-megabit array of such cells could be arranged with 2048 data cells horizontally and 512 data cells vertically, with appropriate reference and dummy cells added as illustrated. The figure also shows an option for adding an extra dummy cell where contacts between the MTP word line and a parallel metal layer may be inserted for the purpose of lowering the resistance of the MTP word line. Typically, this dummy cell may be placed every 32 or 64 data cells.

FIG. 19 is a top view of a small portion of the semiconductor structure illustrating the anode 'hop' of the thyristor enabling an interconnection to the anode of a reference cell. Conductive metal line 237 (also see FIG. 14) extends in parallel to the metal line 270 that connects to the data cell anodes. The location of the cross sectional views of FIGS. 14 and 15 are shown. Note that the dummy cell adjacent to the reference cell has been omitted from the figure.

C. READ Operation of the MTP-Thyristor Memory Device

The values of the voltages to read the contents of the MTP transistor 21 and the MTP-thyristor memory cell are dependent upon the different constructions of the MTP-thyristor memory cell. Particular voltages for the Read operations (and for Program and Erase operations) were given above with the description of the different constructions of the MTP-thyristor memory cell. The voltages described are exemplary, and are not to be considered as limiting the inventions described herein.

To explain the Read operation dynamically, a particular set of initial values (and MTP-thyristor cell construction) is presumed. For this example, for the selected memory cell A in FIG. 3, the bit line 30 is set to 0 volts and the anode line 34 is set to 1.4 volts. The WGND line 36, the WWL line 35, ERL line 32 and BSNW line 31 are all set to 0 volts. The MTP-WL line 33 is precharged to 0 volts and then ramped upward to begin the Read operation of cell A. For the described embodiment, a rate of approximately 100 mV/ns is preferred for the line 33. Of course, other rates may also be used.

Figure 20A:
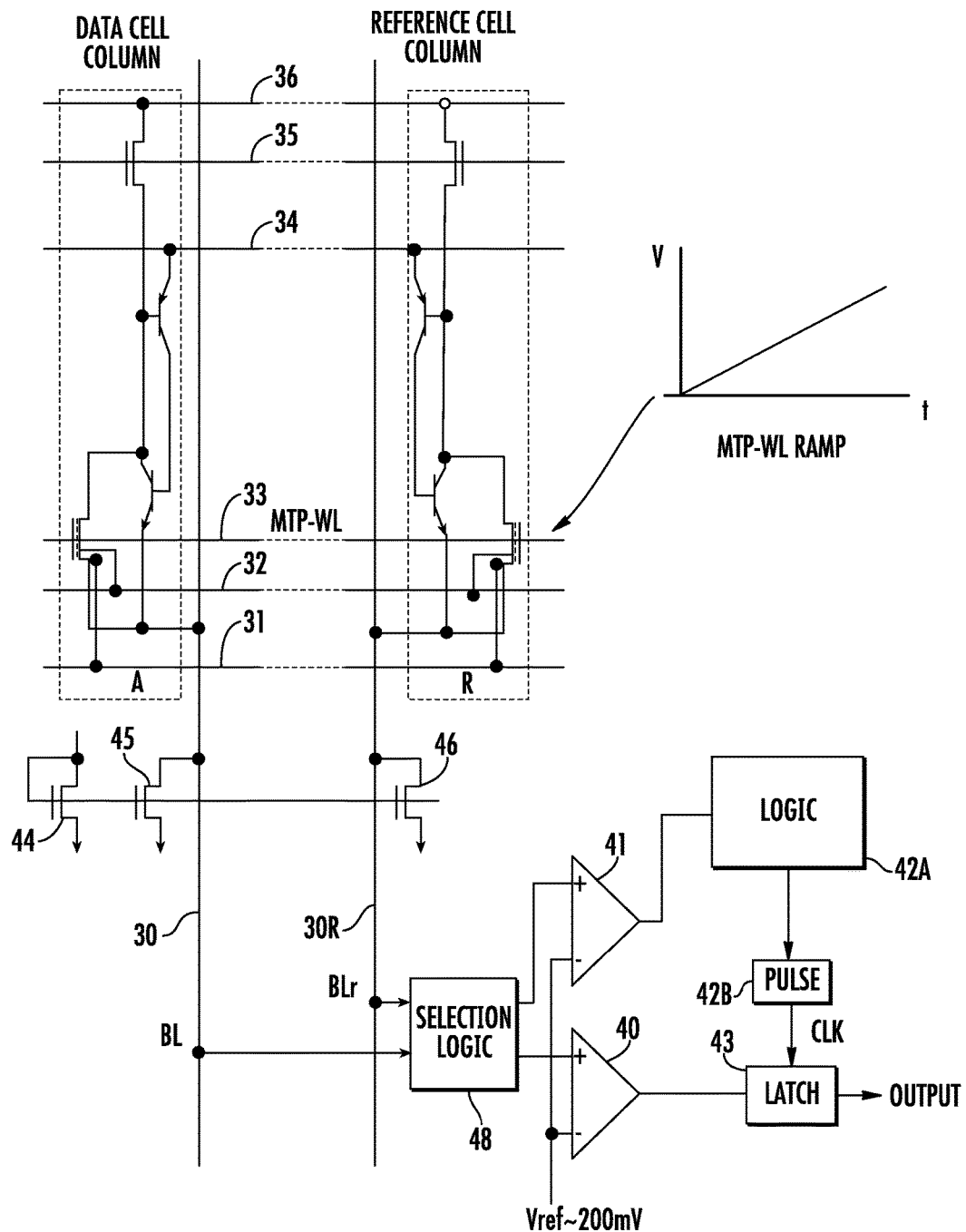
FIG. 20A shows a circuit diagram for a Read operation to retrieve information from an array of MTP-thyristor memory cells.

FIG. 20A shows the circuitry for a Read operation of a selected data memory cell, memory cell A. The same circuitry is also used for the Verify operation which is explained in detail below with additional details. A corresponding reference memory cell connected to the same MTP-WL line 33 as the selected memory cell is used to read the selected memory cell. This arrangement physically ties a data memory cell to its corresponding reference cell. Variations in the manufacturing process and changes in operating temperatures affect the data cell and reference cell equally so that any changes track desirably together.

In FIG. 20A the memory cell A is connected to the bit line 30 and the reference cell R connected to the bit line 30R. MOSFET transistors 45 and 46 provide current mirror bit line loads (set by MOSFET transistor 44) for the bit lines 30 and 30R respectively. The contents of the memory cell A are read by a comparison of the voltages on the bit lines 30 and 30R with a voltage reference of approximately 0.2V by two differential sense amplifiers 40 and 41, as the voltage on the MTP-line 33 is ramped upward as indicated by the graph in the upper righthand portion of the drawing. Selection logic shown by a block 48 determines which bit line signals are sent to the + input terminals of the sense amplifiers 40 and 41 dependent upon whether a Read or Verify operation is to be performed. It should be noted that alternatively selection logic can also be placed at the outputs of the sense amplifiers 40 and 41 for Read and Verify operations.

For a Read operation, the BL data memory bit line 30 is connected to + terminal of the amplifier 40 and the BLr reference memory bit line is connected to the + terminal of the amplifier 41. A latch 43 preserves the output of the sense amplifier 40. The output latch 43 is triggered by a latch trigger pulse, labeled CLK, from a pulse generation circuit 42B which, in turn, is triggered by a signal from a logic block 42A. In the Read operation, the logic block 42A receives an input signal from the reference memory cell trigger amplifier 41. The amplifier 41 provides a signal when the voltage on the reference memory cell bit line 30R rises above the 0.2V reference voltage. The switching of differential sense amplifier 41 determines when the latch 43 for the Read operation captures the signal from the differential amplifier 40.

Figure 20B:
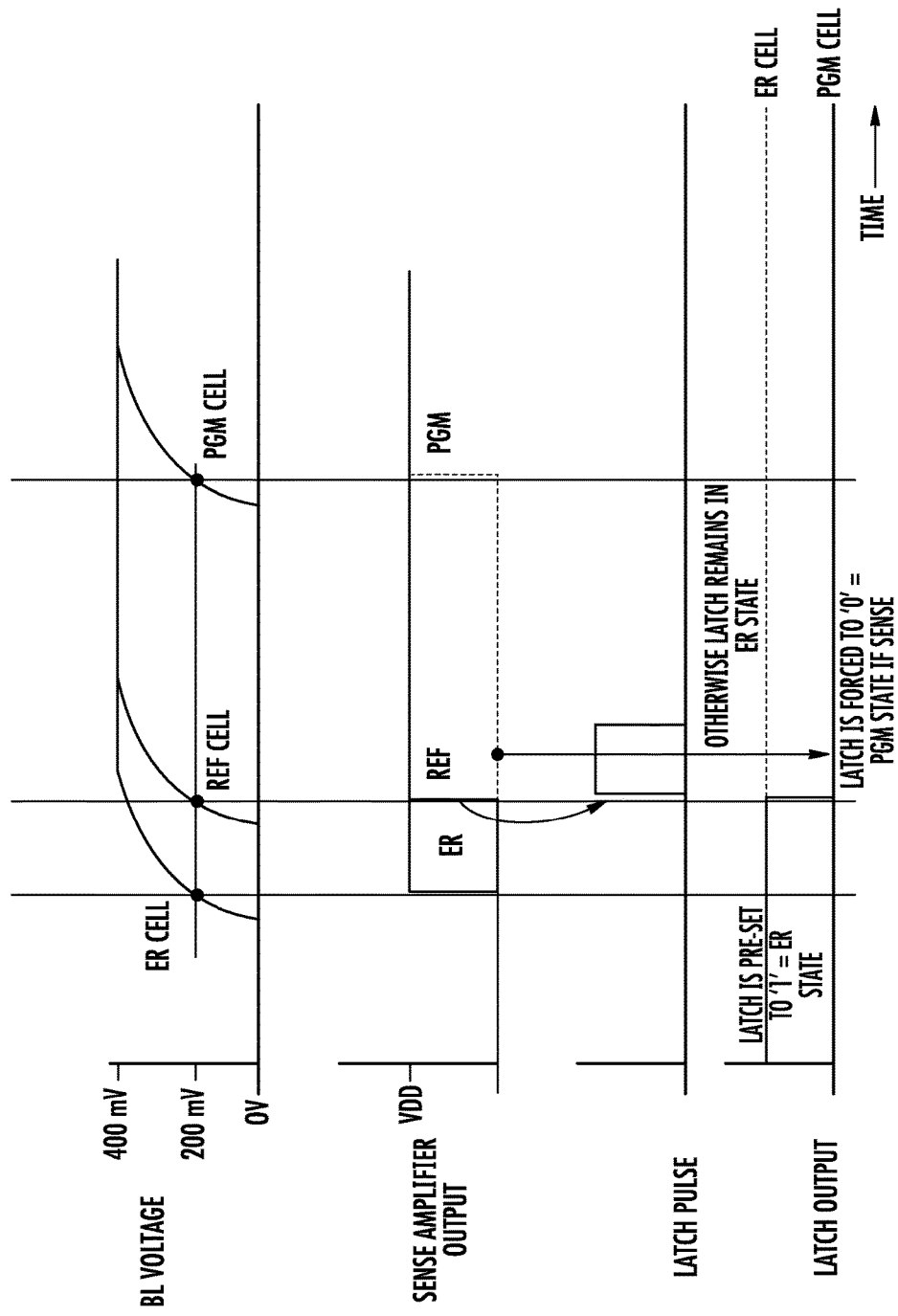
FIG. 20B shows the timing of the Read operation of FIG. 20A.
Figure 20C:
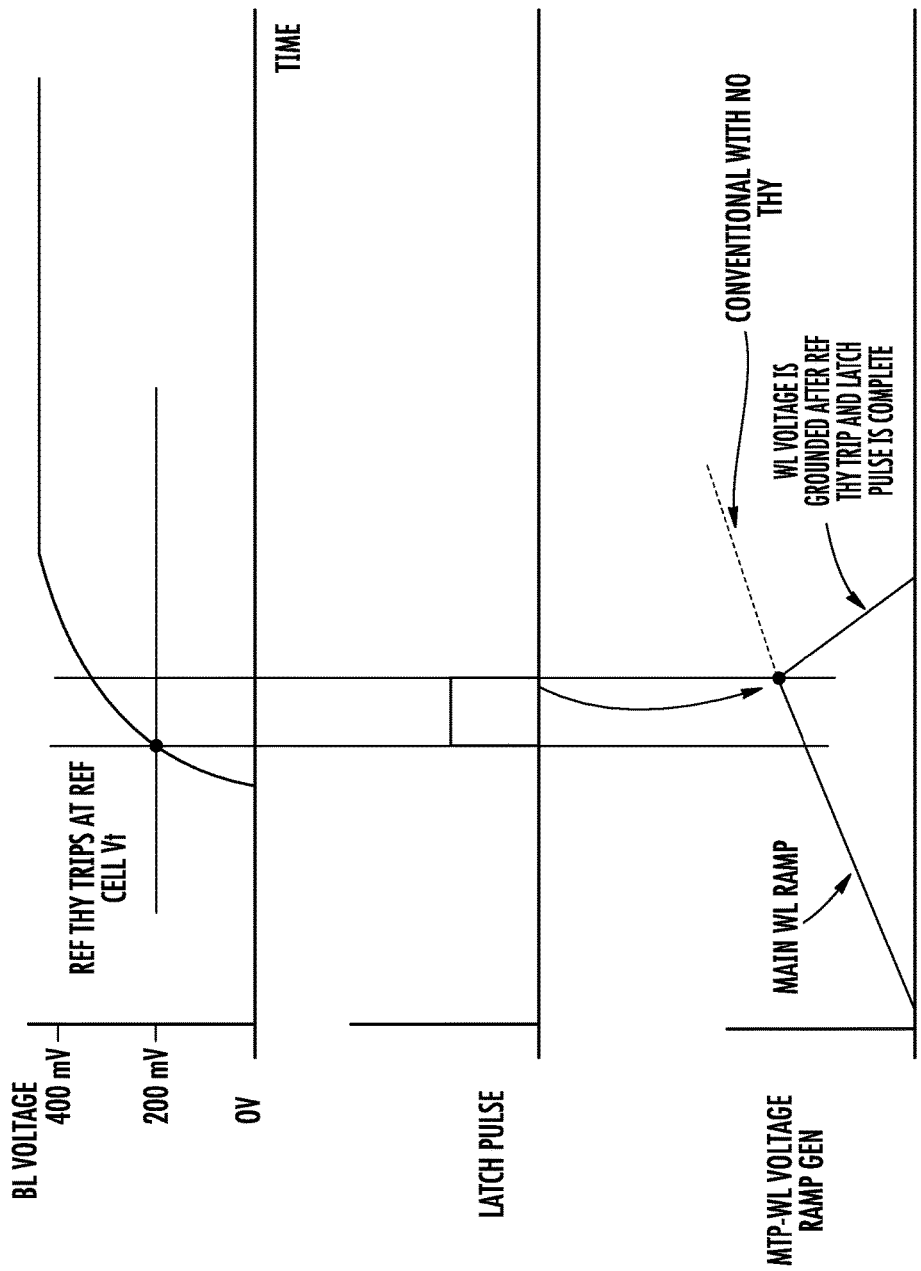
FIG. 20C shows the timing of the grounding of the MTP-WL line after a Read operation and FIG. 20D shows a flow chart of the general steps of a Read operation.
Figure 20D:
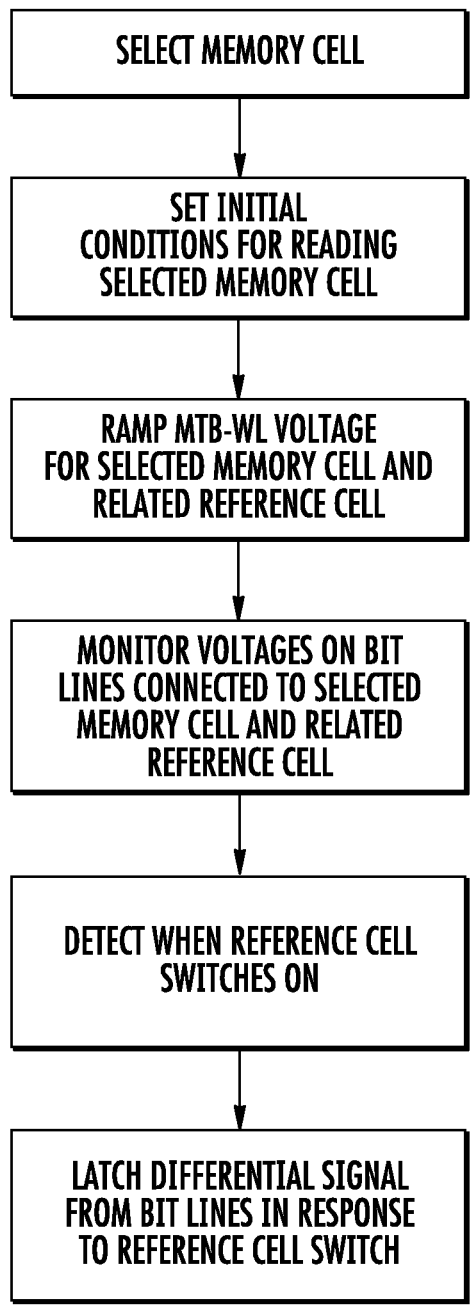

The Read operation may be better appreciated with reference to FIG. 20B that illustrates the timing of a Read operation of the selected MTP-Thyristor memory cell A with the FIG. 20A circuitry and also to FIG. 20C which shows some of the operation's general steps. In the vertical axis, the drawing represents the voltage at different locations of the FIG. 20A circuits, i.e., the data and reference bit lines 30 and 30R (BL Voltage graph), the output of the differential sense amplifier 40 (Sense Amplifier Output graph), the output of the pulse circuit 42B (Latch Pulse graph) and the output of the latch 43 (Latch Output graph). The horizontal axis is the time axis. Again, the particular numbers shown here are illustrative and should not be considered as limitations.

Upon selection of a memory cell to read, the voltage on the MTP-WL line 33 (see FIG. 20A) of the selected cell A (and its corresponding reference cell R) ramps up, as shown by the graph in the top righthand corner of FIG. 20A. As stated previously, a ramping rate of ~100 mV/ns for a Read operation is used, though other rates can be used. If the selected MTP-Thyristor memory cell A has been Programmed, i.e., electrons have been stored in its floating gate or charge trapping region to render a logic "1," its threshold voltage $V_T$ is higher than that of the reference memory cell R. More positive voltage is required on the gate of the MTP transistor to render its channel region conducting and to turn on the MTP-thyristor cell. Hence the rising voltage on the MTP-WL line 33 turns on the reference memory cell R first. The resulting current through the load 46 causes the voltage on the reference bit line 30R to rise before the bit line 30 for the selected memory cell A. This is shown in the BL Voltage graph of FIG. 20B which superimposes the voltages of the two bit lines 30 and 30R. The rise form for the "Ref cell" occurs before the rise form of the "PGM cell."

If, on the other hand, the selected MTP-thyristor memory cell A has been Erased, i.e., electrons have been removed or neutralized in its floating gate or charge trapping region to render a logic "0," its threshold voltage $V_T$ is lower than that of the reference memory cell R and less positive voltage is required on the gate of the MTP portion of the selected memory cell A to turn it on. Hence the memory cell A turns on before the reference cell R and the voltage on the bit line 30 rises before the reference cell R, as shown in the first (top) of FIG. 20B. The rise form for the "ER cell" occurs before the rise form of the "Ref cell."

It should be noted that as the difference $\Delta V_T$ between the threshold voltages of a memory cell in its Programmed state and reference memory cell, or in its Erased state and reference memory cell, becomes smaller, the rise forms in Graph B becomes closer together.

The Sense Amplifier Output graph in FIG. 20B shows the outputs of the differential sense amplifiers 40 and 41 as the bit-lines 30 and 30R make their transitions. The waveform labeled "Ref" is the sense amplifier 41 response to the reference bit-line 30R rising above the sense amplifier reference input voltage level, 0.2V. The waveforms labeled "ER" or "PGM" is the sense amplifier 40 response to the data bit line 30 rising above the sense amplifier reference input voltage level, 0.2V, for the case of an Erased bit-cell or a Programmed bit-cell respectively. The output from the sense amplifier 41 is used to trigger a single latch pulse "CLK" at the output of the pulse generation circuit 42B. This pulse is shown in the Latch Pulse graph of FIG. 20B. During the high time of the latch pulse the output from sense amplifier 40 is transferred into the latch 43. At the end of the latch pulse, the output from the sense amplifier 40 is captured in the latch and made available at the latch output shown in the Latch Output graph of FIG. 20B. Prior to the occurrence of the latch pulse, the logical content of the latch 43 is pre-set to a digital '1' state. If the state of the array bit-cell, represented by data memory A in FIG. 20A, is Erased, the latch will continue to hold a '1' state after the latch pulse has finished. If the state of the array bit-cell is Programmed, the latch will have switched to hold a '0' state after the latch pulse has finished.

After the data read from the selected memory cell has been latched, the voltage on the MTP-WL line 33 is grounded, as shown in in the MTP-WL Voltage Ramp Gen graph of FIG. 20C. The MTP-WL may be grounded after the thyristor in the reference bit-cell has switched and the latch pulse has returned to digital '0' state shown in the Latch Pulse graph of FIG. 20C. While the Read operation could continue with a rising voltage as shown by the dotted line, the rapid grounding of the MTP-WL line minimizes stress or "read disturb" on the memory cells being read and on the memory array as a whole. Previous techniques drove the gate voltage on the memory cell being read continuously through the Read mode to a voltage significantly higher than the threshold voltage $V_T$ of the MTP device to create a high source/drain current for a sense amplifier to operate at adequate speeds for the Read operation. The described Read operation circuits have advantageously no such requirements. This grounding of the MTP-WL line 33 is also performed for the Verify operation described below with the same benefits.

It has been found that described circuits and operation can discriminate threshold differences $\Delta V_T$ as small as 50 mV. This provides an enormous advantage in operating speeds and in reduced stress over present day MTP memory arrays.

Additionally, the MTP-thyristor memory cell of the present invention substantially ameliorates a problem common to conventional MTP memory cells. Such memory cells are often found in an "over-erased" condition, i.e., that after an Erase operation too many electrons have been removed from (or too many holes have been injected into) the charge storage region of the MTP so that its threshold voltage $V_T$ is negative. If the gate voltage of an over-erased MTP is simply left neutral or at 0 volts, the MTP is On and conducting. Such cells create leakage currents onto the connected bit lines, an undesirable situation. A solution has been to insert another MOSFET (the MTP being the first MOSFET) into the memory cell to block the leakage from the MTP with negative $V_T$ from the bit line.

The advantage of the MTP-thyristor memory cell is illustrated with reference to FIG. 3. If an unselected memory cell in an over-erased condition as represented by the unselected data memory cell C, for example, its leakage current is blocked by the J1 junction of the memory cell's thyristor. The J1 junction is the first PN junction from the thyristor's anode. See FIG. 1B. The action of the junction can be observed when a selected memory cell (cell A in our example) switches. The voltage on the connected bit line 30 rises from 0 to about 0.2 to 0.4 volts. The unselected cells connected to the bit line 30 represented by memory cell C have their anodes set to 0 volts thus creaking potential current paths from the bit line 30 to the anode lines 34u through the unselected memory cells C. If the unselected cells are in an over-erased condition and their threshold voltages $V_T$ are negative, i.e., the MTP of the unselected cells are ON and conducting. However, the base-emitter junction of the thyristor PNP transistor 10 (referring to FIG. 1B), the thyristor J1 junction, is reversed-biased. This prevents current leakage to ground. Again using memory cell C as an example, no current can leak from the bit line 30 through the cell's MTP to its DCAL line 34u.

D. WRITE Operations (Program or Erase) of MTP-Thyristor Based Memory Device

For a Write operation, whether to Program a memory cell (adding negative charges to the charge storage region) or to Erase a memory cell (removing charges from, or adding positive charges to, the charge storage region), the voltages are typically dependent upon the construction of the MTP-thyristor memory cell.

For the Programming voltages below, a memory cell in which the MTP and thyristor areas are separated but share a well and bit line contact is used as an example. Using the selected memory cell A in FIG. 3, the bit line 30 (also connected to memory cell C) is set to +3 volts, the bit line 30u set to 0 volts for the unselected memory cells B and D, and the bit line 30R set to 0 volts for the reference memory cells R and R1. The WGND lines 36 and 36u are set to 0 volts. The WWL (Write-word line) 35 is set to +2.5 volts, while the WWL line 35u to the unselected memory cells C, D is set to 0 volts. Both DCAL lines 34 and 34u are set to 0 volts. The MTP-WL line 33 is set to +5 volts; while the MTP-WL 33u to the unselected cells C, D is set to 0 volts. The ERL (Erase line) 32 to the memory cells A and B, selected and unselected is set to −2 volts, while ERL 32 to the reference memory cell R is set to 0 volts. This separation in the ERL line between data memory cells and reference cells is a result of the particular memory cell construction. Likewise, the ERL (Erase line) 32u to the unselected memory cells C and D is set to −2 volts, while ERL 32u to the reference memory cell R1 is set to 0 volts. Finally, the BSNW (Buried Shallow N-Well) line 31 and 31u are set to 0 volts. In this manner the selected memory cell A is programmed without interfering with the other, unselected memory cells in the array.

For the Erasing voltages below, the same memory cell construction in which the MTP and thyristor areas are separated but share a well and bit line contact is used as an example. Note that an Erase operation is performed in rows so that rather than a selected memory cell, a row (or two) of memory cells is selected for Erasing. With the memory cell A in a selected row in FIG. 3, all the bit lines 30 and 30u connected to memory cells in the selected row are set to +5 volts, and the bit line 30R for the reference memory cells R and R1 is set to 0 volts. The WGND lines 36 and 36u are set to +2.5 volts. The WWL (Write-word line) 35 to the memory cells A and B in the selected row, and the WWL line 35u to the unselected memory cells C, D are set to +2.5 volts. Both DCAL lines 34 and 34u are also set to +2.5 volts. The MTP-WL line 33 (and its adjacent MTP-WL) is set to −5 volts; while the MTP-WL 33u to the unselected cells C, D is set to 0 volts. In this example a double row of memory cells is being erased at same time. The ERL (Erase line) 32 to the memory cells A and B in the selected row is set to 0 volts, and the ERL 32 to the reference memory cell R is set to 0 volts. As noted above, there is a separation in the ERL line between data memory cells and reference cells. Likewise, the ERL (Erase line) 32u to the memory cells C and D in the unselected row is set to +2.5 volts, while ERL 32u to the reference memory cell R1 remains at 0 volts. Finally, the BSNW (Buried Shallow N-Well) line 31 and 31u are set to +2.5 volts. In this manner the selected row(s) including memory cell A is erased without interfering with the other unselected rows of memory cells in the array.

Figure 21A:
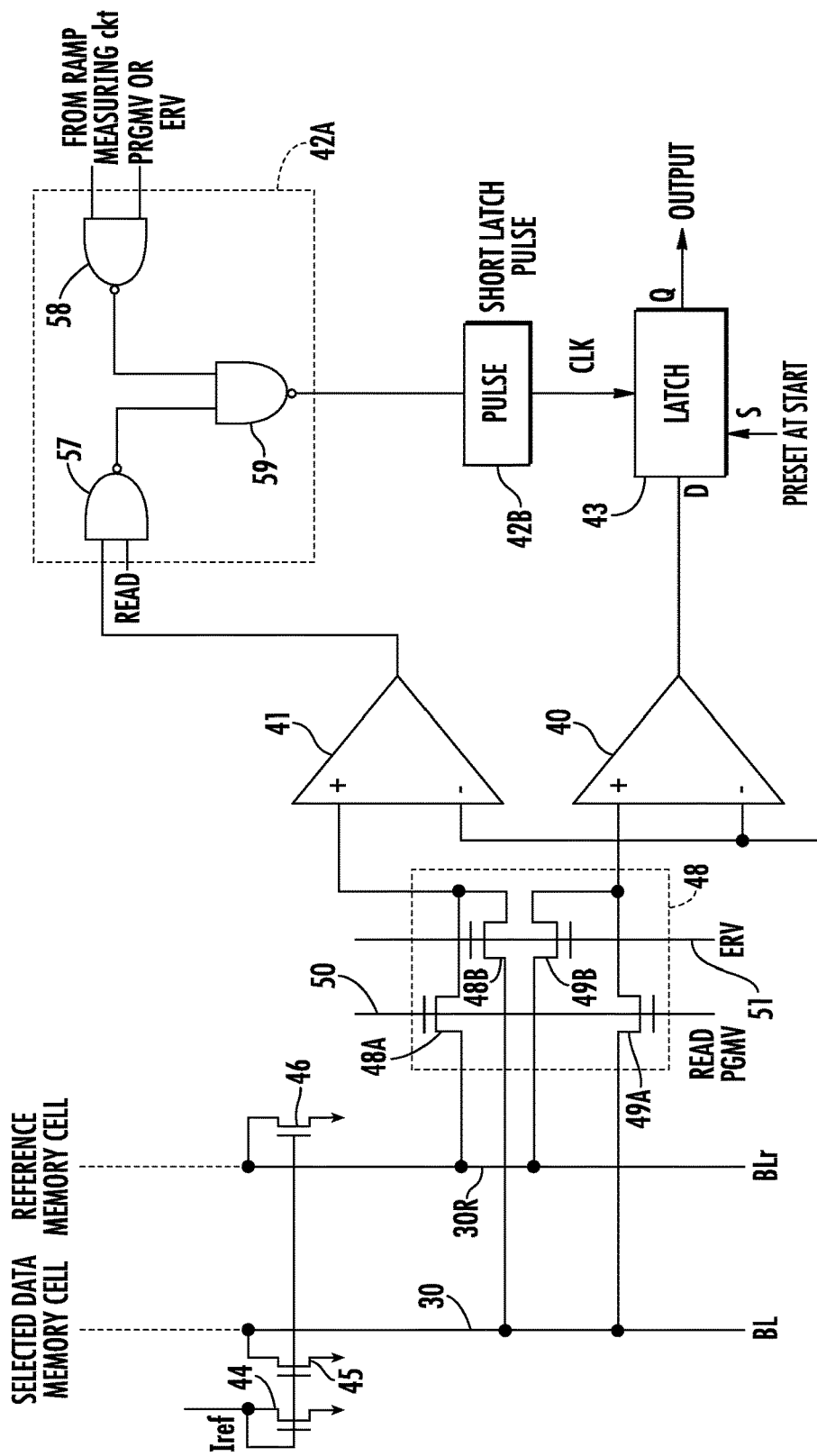
FIG. 21A shows further details of the FIG. 20A circuit diagram for a Verify operation after a Program or Erase operation to retrieve information from an array of MTP-thyristor memory cells.

After writing data into the array, whether a selected memory cell is to be Programmed or Erased, the state of the memory cell must be checked, i.e., Verified. This ensures that the information written is, in fact, correct. FIG. 21A shows additional circuitry details to that of FIG. 20A used to Verify the Programmed and Erased memory cells. The selection logic block 48 and logic block 42A in the FIG. 20A circuitry are shown in greater detail.

MOS transistors 48A, 48B, 49A and 49B of the selection block 48 select the inputs to the differential sense amplifiers 40 and 41. When the transistors 48A and 49A are ON (and the transistors 48B and 49B are OFF), the "+" input terminal of the amplifier 40 is connected to the bit line 30 for the selected memory cell A and the "+" input terminal of the amplifier 41 is connected to the bit line 30r for the reference memory cell R. The "−" input terminal of both amplifiers is connected to the sense amplifier voltage reference of approximately 0.2V. The MOS transistors 48A, 48B, 49A and 49B are in this state for a Read operation and a Program Verify operation. When the transistors 48A and 49A are OFF and the transistors 48B and 49B are ON, "+" input connections to the amplifier 40 and 41 are swapped. The "+" input terminal of the amplifier 40 is connected to the bit line 30r for the reference memory cell R and the "+" input terminal of the amplifier 41 is connected to the bit line 30 for the selected data memory cell A. This state is for a Verify operation of an Erased data memory cell. The selections are made according to whether the circuit operation is a Read, or if a Verify operation, whether the Verify operation is for a Programmed cell or an Erased cell. Hence the control line 50 to the gates of the transistors 48A and 49A is labeled "Read/PGMV" (Read/Program Verify) and the control line 51 for the gates of the transistors 48B and 49B is labeled "ERV" (Erase Verify).

For the logic block 42A internal NAND logic gates receive a Read, a Verify (whether for a Programmed or an Erased memory cell), and a ramp measuring circuit control input lines, besides the output signal from the sense amplifier 41. The sense amplifier 41 output starts the block 42A which after a delay issues a signal to the pulse generation block 42B for a Verify operation. The resulting pulse to the output latch 43 times the capture of the signal from the differential sense amplifier 40. A Read operation, as described above, has a zero delay.

More details of the logic block 42A are described below for Verify operations for a Programmed data memory cell and for a Erased data memory cell.

E. Verify Operation for a Programmed MTP-Thyristor Memory Cell

Figure 21B:
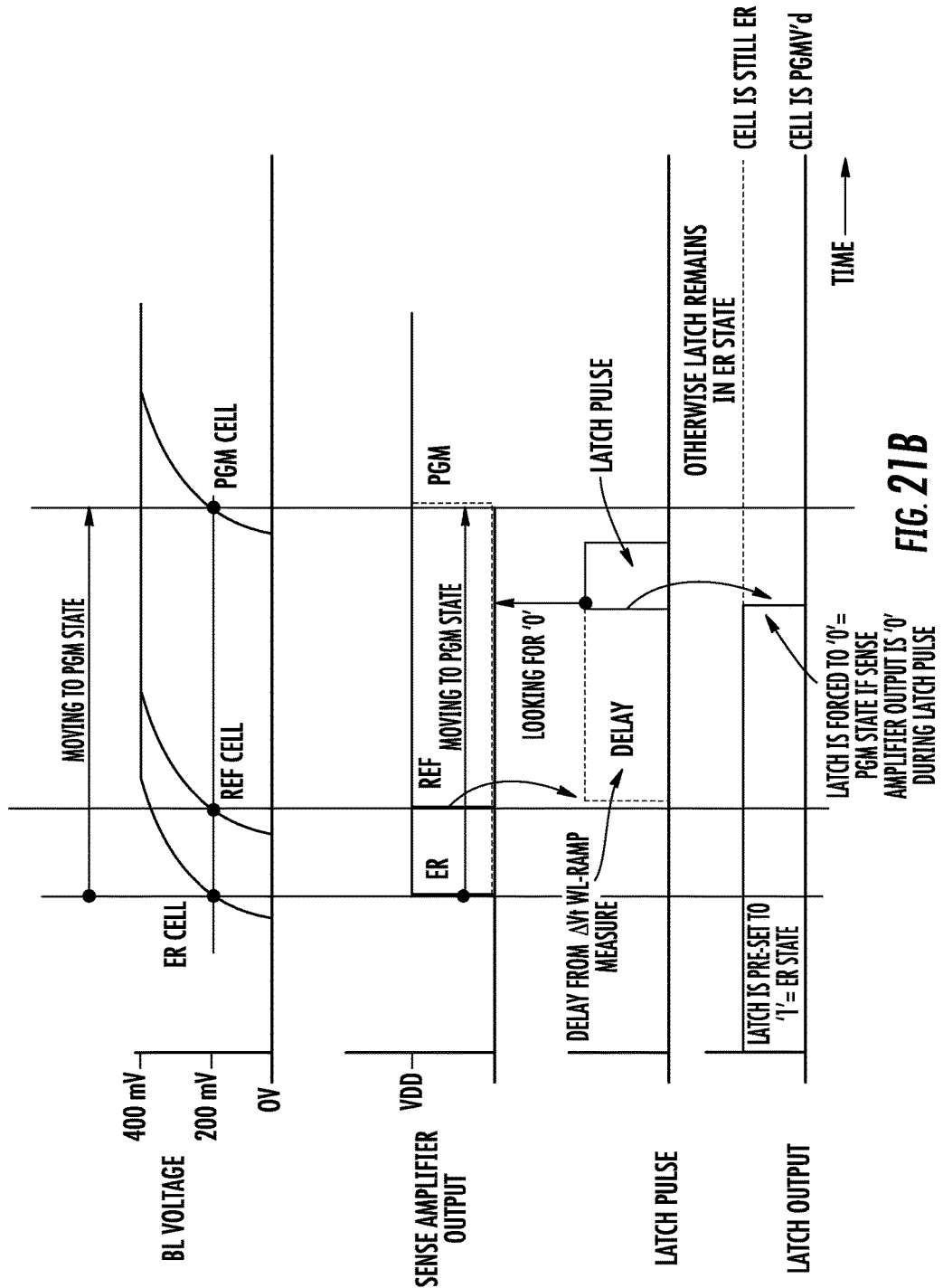
FIG. 21B shows the timing of a Verify operation for an MTP-Thyristor memory cell which has been Programmed.

To Verify that a selected memory cell has been Programmed, the control lines 50 and 51 turn ON the transistors 48A and 49A and turn OFF the transistors 48B and 49B so that resulting circuit configuration is the same as for a Read operation. Likewise, the voltages on the various conducting lines are set as in a Read operation and the voltage on the MTP-WL line 33 (see FIG. 6A) of the selected cell A (and its corresponding reference cell R) ramps up. Rather than the ramp rate of 100 mV/ns for a Read operation, a slower ramp rate might be used for Verify operations. Referring to FIG. 21B, the output latch window shown by the third graph (latch pulse) is triggered in regular Read mode when the rising voltage of the BLr 30R for the reference cell R hits a predetermined value, here shown as 200 mV. However in Program Verify mode, the latch window is delayed by a time determined by the block 42A (illustrated by the "delay" outline by dotted lines in the Latch Pulse graph). The delay is initiated by the BLr 30R exceeding a predetermined voltage. The latch window is triggered at the end of the delay. This causes the sense amplifier 40 to generate a "0" at its output only when sufficient separation between the reference cell VT and the Programmed data cell VT is attained. This happens when the trace in BL voltage graph labeled "PGM cell" and the trace in the sense amplifier output graph labeled "PGM" has moved substantially to the right of the trace "Ref cell" and "Ref" respectively, which occurs as the data cell becomes more Programmed. "More Programmed" refers to the storage of more electrons in the charge storage region of the MTP element of the data cell which increases the threshold voltage VT and requires a higher MTP-WL voltage to turn On the data cell. The length of the delay guarantees a minimum threshold voltage difference $\Delta$VT between the reference cell and the data cell. The cell A is Program Verified when a '0' is captured in the latch 43.

If the latch pulse does not fall within the "0" window of the sense amplifier 40 output, a "0" is not captured by the latch 43 and a Programmed state for the selected memory cell is not Verified. In that case, the selected memory cell is programmed again to achieve a larger $\Delta$VT, and the Verify operation is repeated. The selected memory cell is reprogrammed until a "0" is captured by the latch 43. The horizontal arrows in the BL Voltage and the Sense Amplifier Output graphs in FIG. 21B show how these signals from a data memory cell change as the cell which was originally Erased becomes Programmed.

Figures 1, 21C:
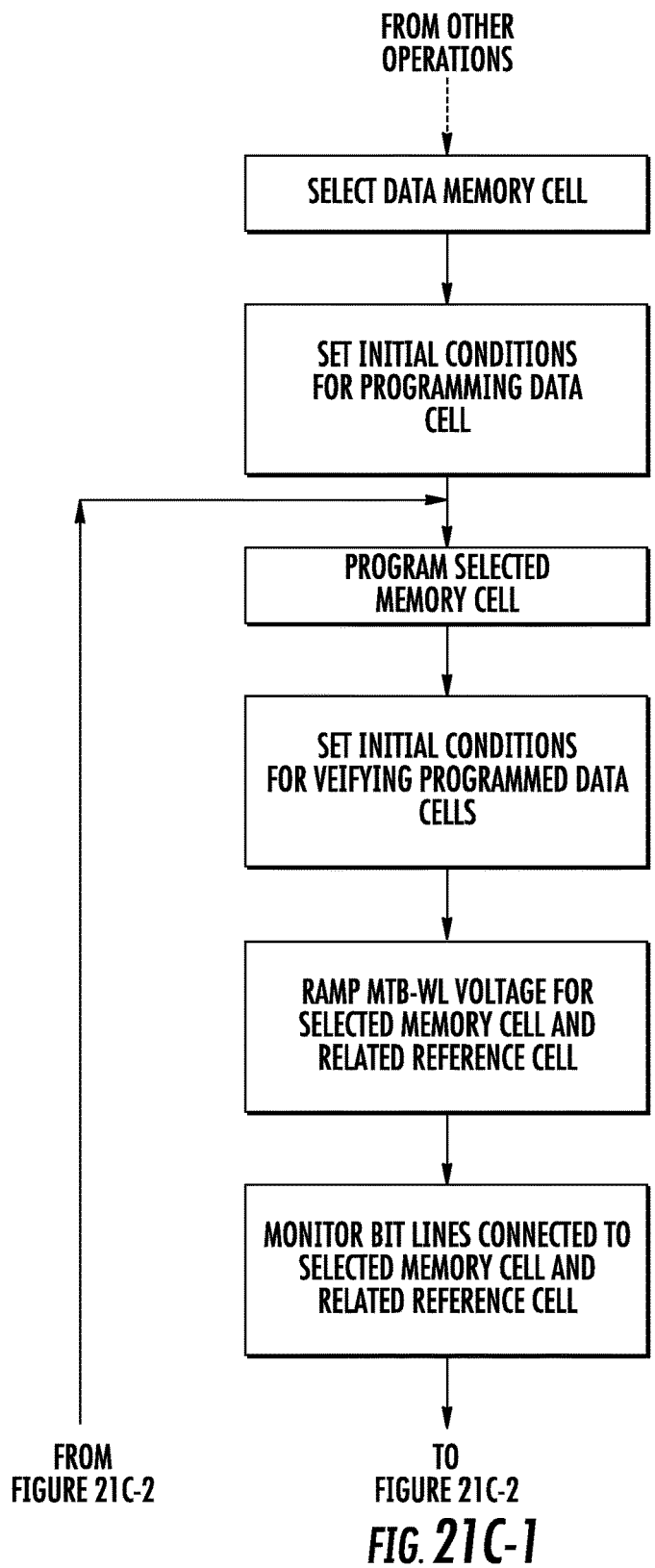
Figures 2, 21C:
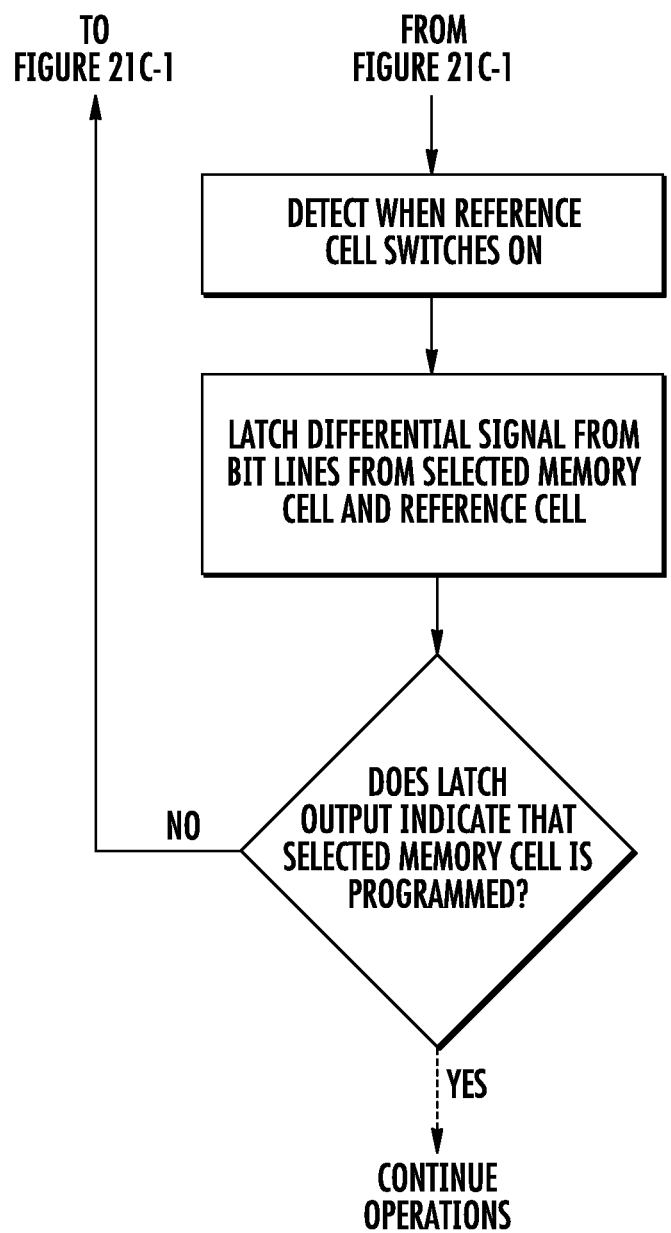

FIGS. 21C-1 and 21C-2 show a flow chart of the general steps to Verify a Programmed data memory cell.

F. Verify Operation for an Erased MTP-Thyristor Memory Device

Unlike the Programming of a memory cell, an Erase operation is applied upon a row of memory cells simultaneously. All the memory cells connected to an MTP-WL line 33, a row in the memory array, are erased at one time. Furthermore, for memory cells as described herein which share a well and bit line contact, two rows of memory cells are erased at the same time. To Verify that a selected memory cell has been Erased, the control lines 50 and 51 turn OFF the transistors 48A and 49A and turn ON the transistors 48B and 49B of the selection block 48 so that reference cell trigger amplifier 41 "+" input monitors the bit line 30 from the selected memory cell and the reference bit line 30R is connected to the "+" input of the amplifier 40. See FIG. 21A. The voltages on the various conducting lines are set as in a Read operation and the voltage on the MTP-WL line 33 (see FIG. 20A) of the selected cell A (and its corresponding reference cell R) ramps up.

Figure 21D:
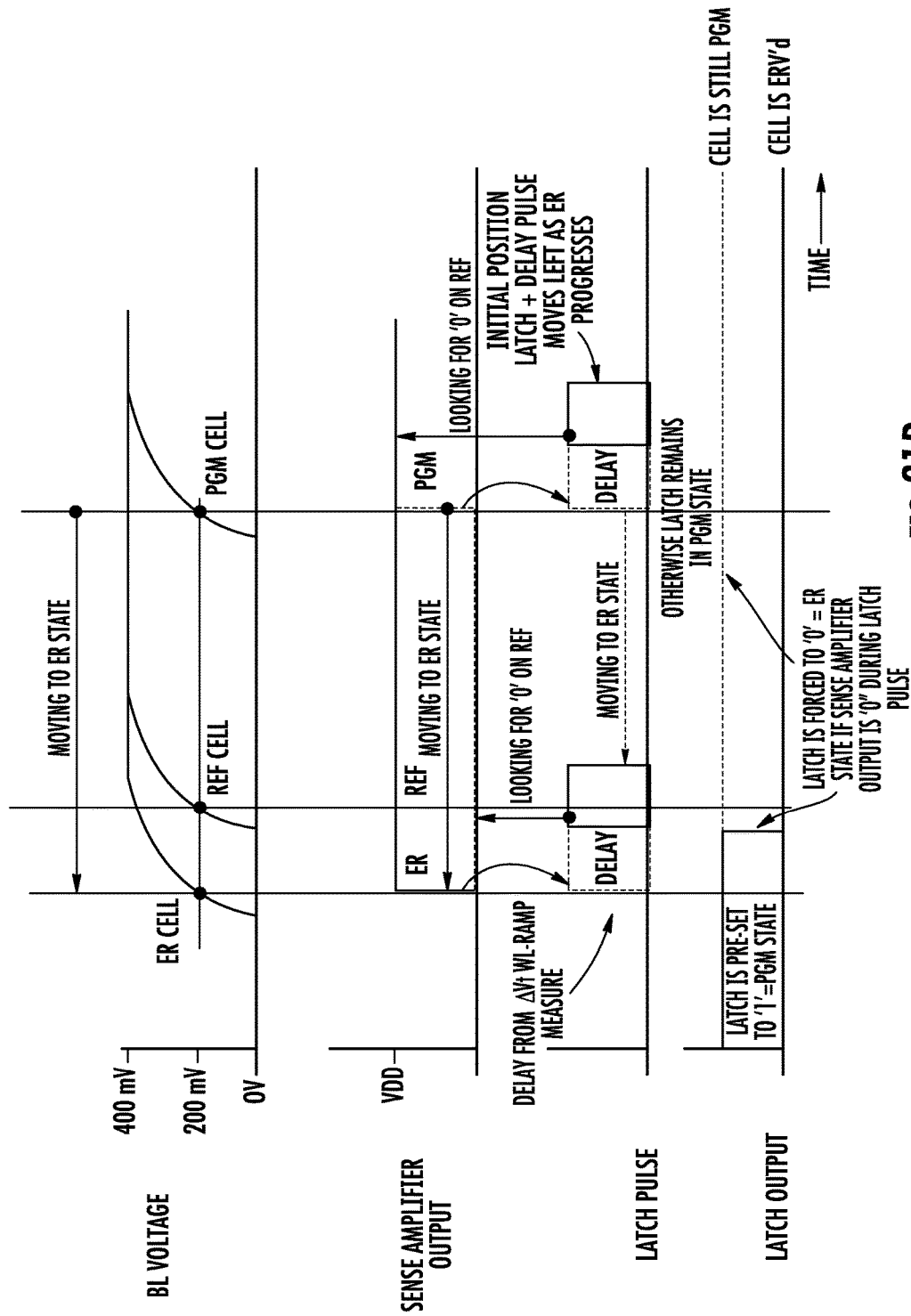
FIG. 21D shows the timing of a Verify operation for a MTP-Thyristor memory cell which has been Erased.

The selected Erased memory cell is now used to trigger the latch 43 via the logic block 42A and latch pulse circuit 42B. This is represented by the left-most vertical line in FIG. 21D. To successfully verify an erased bit cell, the output of the sense amplifier 40 (connected to the reference bit line 30R) must be captured as logic '0' by the data latch 43. This can only occur when the latch pulse has moved significantly to the left of the '0' to '1' transition output from the amplifier 40, positioned by the triggering of the thyristor on the reference cell bit line 30R. In Erase Verify mode, the latch window is delayed by a time determined by the block 42A (see the Latch Pulse graph in FIG. 21D). The delay is triggered by the BL 30 exceeding a predetermined voltage. The latch window is triggered at the end of the delay. This causes the latch 43 to capture a '0' at its output only when sufficient separation between the VT of the Erased data cell and VT of the reference cell is attained (see Latch Output graph in FIG. 21D). This happens when the trace labeled "Ref cell" in the Sense Amplifier Output graph is situated to the right of the trace "ER cell," which occurs as the data cell becomes more Erased. "More Erased" refers to a decrease in the number of electrons in the charge storage region of the MTP element of the data cell which decreases threshold voltage VT and requires a lower MTP-WL voltage to turn On the data cell. The length of the delay guarantees a minimum threshold voltage difference $\Delta$VT between the reference cell and the data cell.

If the output from latch 43 does not confirm that the memory cell A has been Erased, the row of memory cells are Erased again and the Verify operation is repeated. The horizontal arrows in the BL Voltage and the Sense Amplifier Output graphs show how these signals from a data memory cell change as the cell which was originally Programmed becomes Erased. A larger $\Delta$VT increases the spacing between the "ER" and "Ref" signals shown in the Sense Amplifier Output graph of FIG. 21D. The selected memory cell row is re-Erased until the output latch 43 captures a value which Verifies Erasure for all the cells on the row.

Figures 1, 21E:
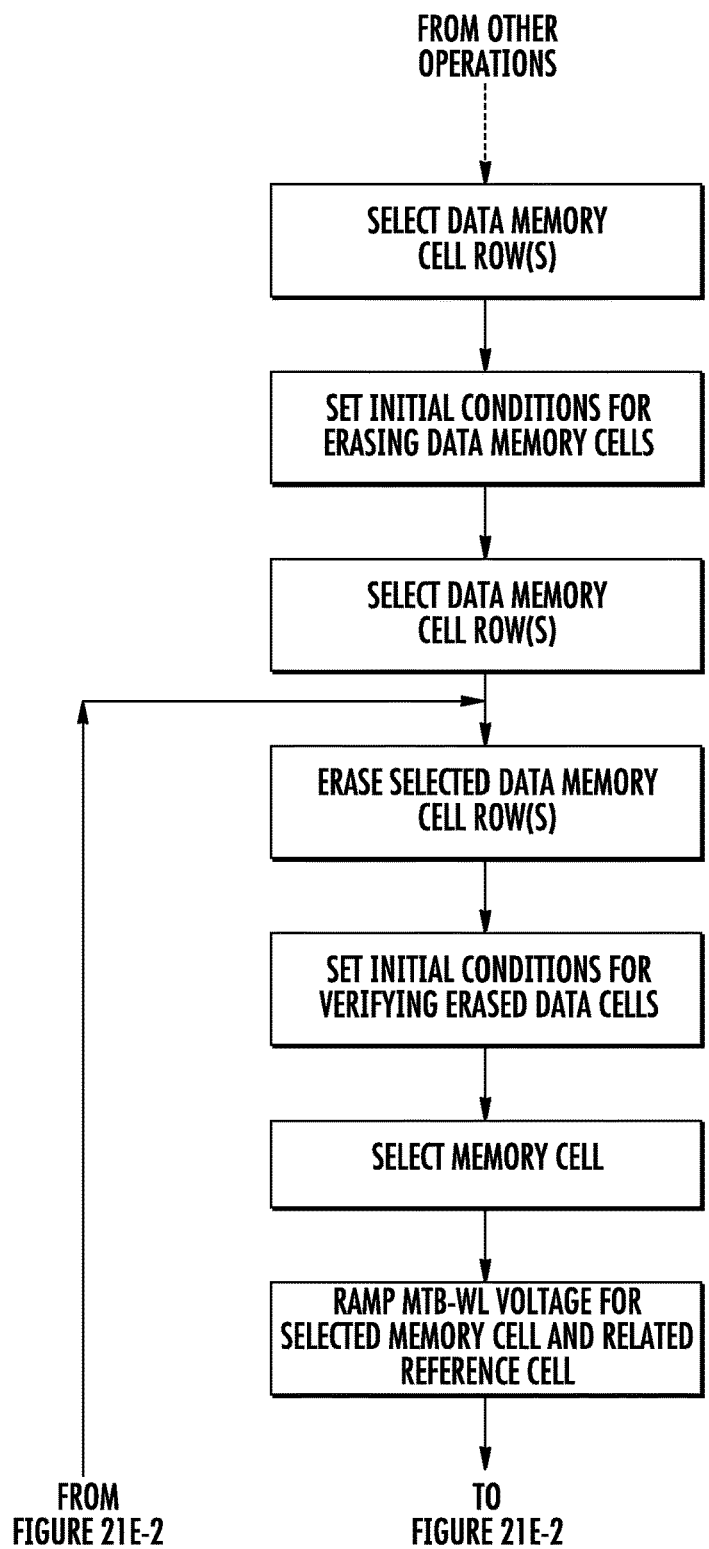
Figures 2, 21E:
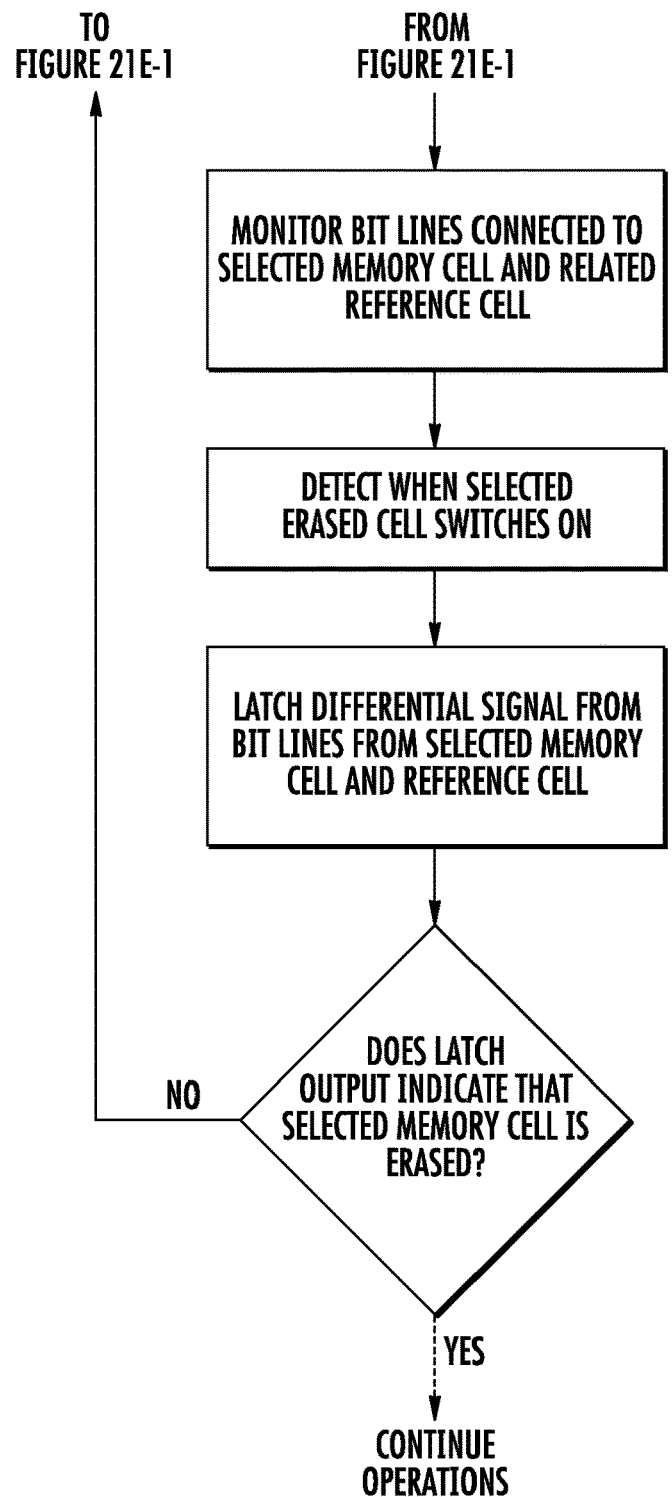

FIGS. 21E-1 and 21E-2 show a flow chart of the general steps to Verify an Erased data memory cell.

G. Verify Operation which Self Tracks Threshold Voltage of Local Reference Cell

In the above-described Verify operations a cell "local" to a selected data memory cell is used as a reference. This is beneficial to operations since the reference cell is subject to similar processing conditions as the data cell and tracks temperature and voltage changes to the data cell. However, the delay in triggering the latch 43 from the sense amplifier 41 determines the $\Delta$VT, the difference in threshold voltages of the selected Programmed/Erased data memory cell and the reference cell, and the required delay is dependent upon the rate at which the MTP-WL line is ramped up. For example, with a ramp rate of 100 mV/ns, a 3 ns delay defines a $\Delta$VT of 0.3V. The ramp rate may change depending upon variations in the manufacturing process of the integrated circuit holding the memory cell array, in the array power supply voltages, e.g., VDD, and in the temperature and other variables. Without a special circuit, these ramp rate variations are difficult to track and an inaccurate minimum $\Delta$VT may result.

Figure 22A:
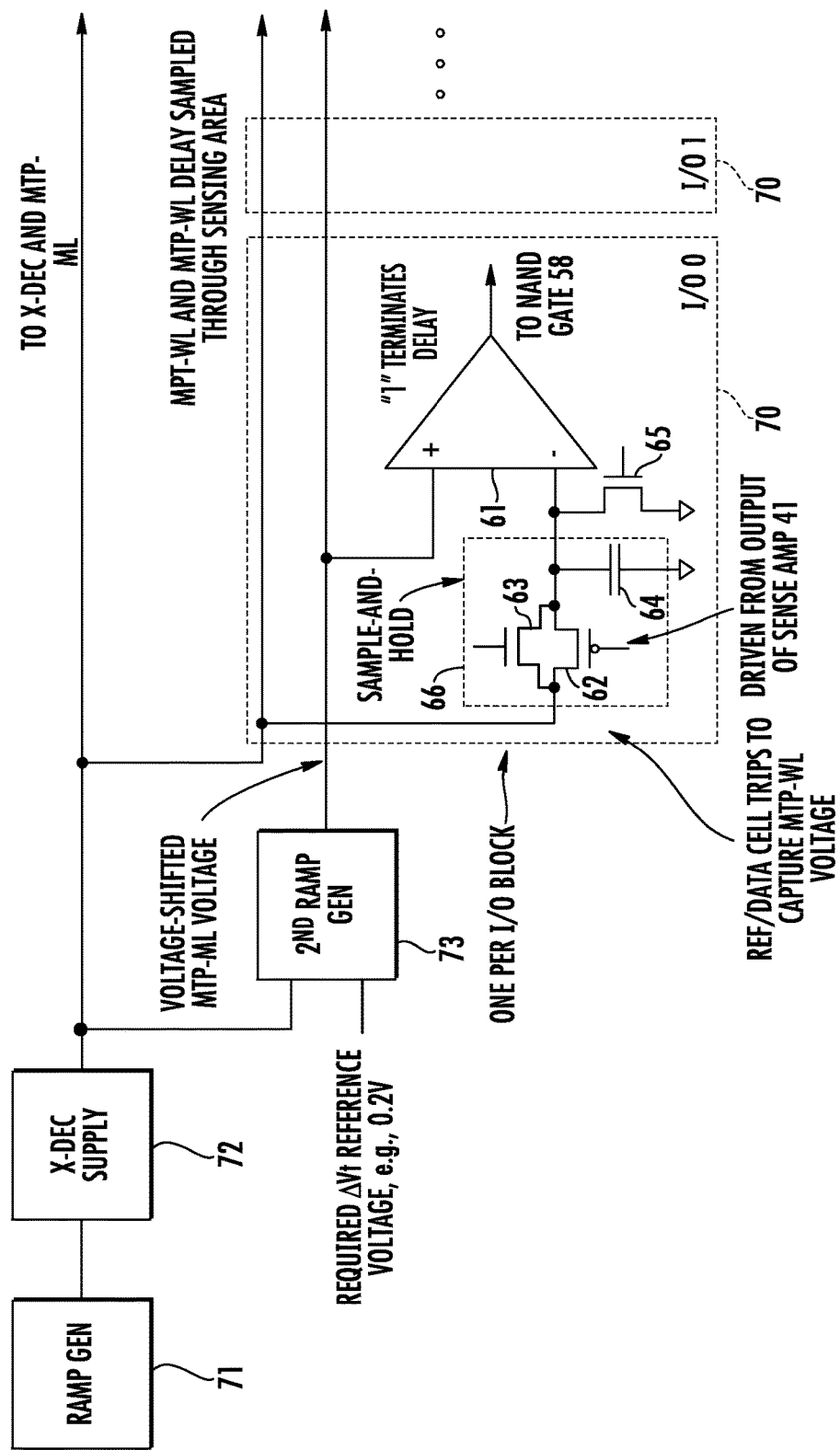
FIG. 22A shows a circuit diagram for Read and Verify operations which work independently of the rate at which the voltage on the MTP-WL line ramps upward.
Figure 22B:
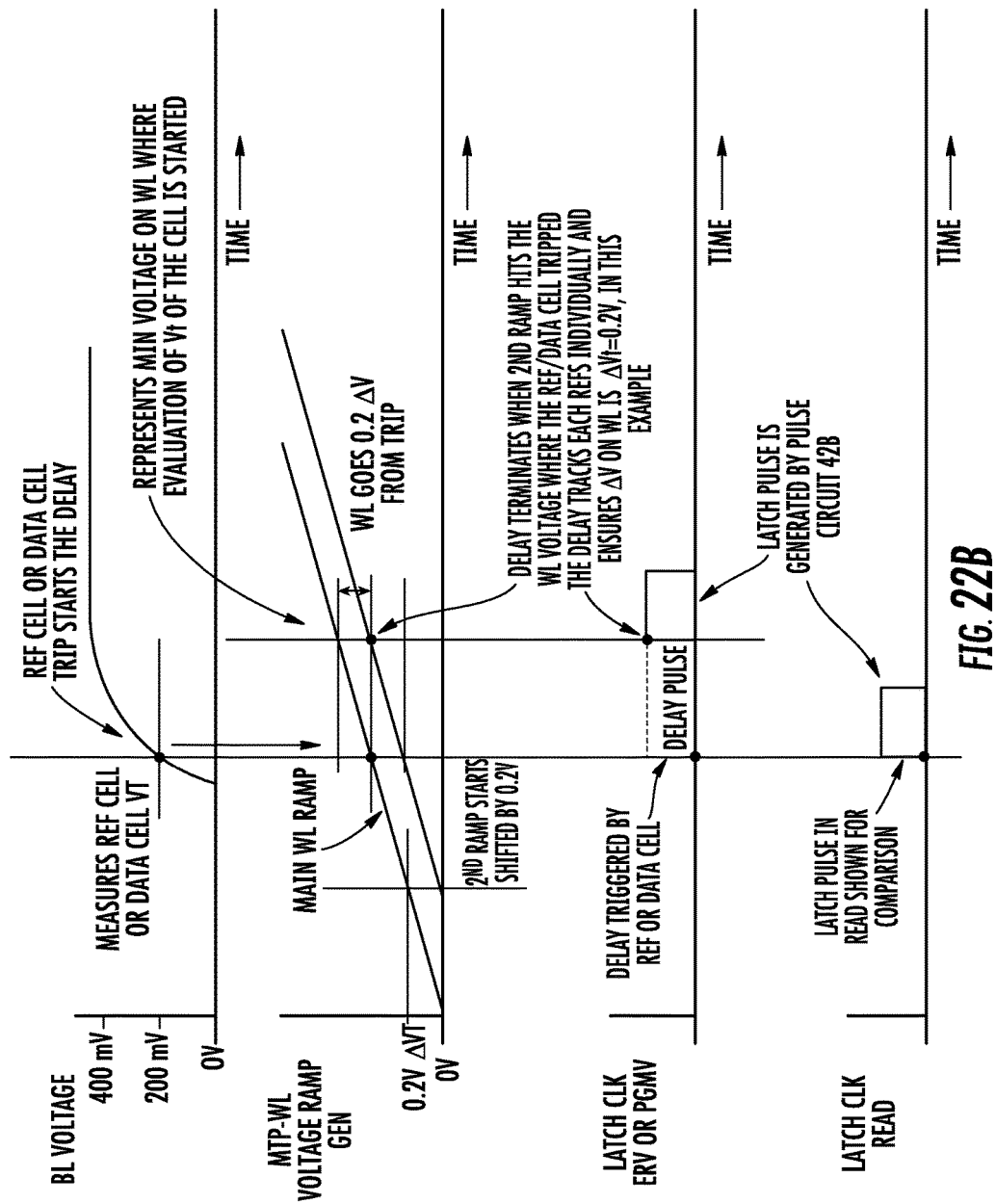
FIG. 22B show the timing of operations of the FIG. 22A circuitry.

Another embodiment of the present invention avoids this problem. With this feature the $\Delta$VT, the difference in threshold voltages of the selected Programmed/Erased data memory cell and its corresponding reference cell, can be set to a particular minimum value, say, 0.2V, and this value is used to define the correct sense latch delay despite any change in the MTP-WL ramp rate. The generated delay ensures that the cell being Verified is at least a specific minimum $\Delta$VT above/below the reference memory cell's VT. The reference memory cells may have differing VT's so the described embodiment tracks each reference cell separately. Of course, other threshold voltage differences can also be used. FIGS. 21A and 22A are diagrams of circuits which implement this feature and FIG. 22B show the resulting timing of operations. As noted previously, the same reference numerals are retained for elements which are unchanged from previous drawings.

The circuit diagram of FIG. 21A shows that the logic block 42A has three NAND logic gates: the first NAND gate 57 receives the output from the reference memory cell trigger amplifier 41 and a Read operation control signal, the second NAND gate 58 receives the output from a ramp measuring circuit described below and Program Verify/Erase Verify control signal, and the third NAND gate 59 receives the output of the first two NAND gates 57 and 58. The Read operation control signal is a logic "1" when a Read operation is being performed and a logic "0" otherwise. The Program Verify/Erase Verify control signal is a logic "1" if a Verify operation is being performed (whether for a Programmed data memory cell or for a Erased data memory cell) and is logic "0" otherwise. The described logic elements contained in block 42A perform the required logical function. Other logic implementations are possible to achieve the same function.

FIG. 22A shows the circuitry which includes the ramp measuring circuit and operates with a connection through to the block 42A shown in FIG. 21A. A ramp generator block 71 and an X-decoder power supply block 72 create and distribute the ramping voltage to X-decoders and on to the selected MTP-WL lines. A second ramp generator block 73 also receives the output from the ramp generator block 71 (and X-decoder supply block 72) as a first input, and the required ΔVT, shown as 0.2V in this example, as a second (or reference) input. The second ramp generator is designed with identical components to the first ramp generator (and therefore generates a substantially identical ramp to the first ramp generator); however it also contains a voltage comparator at the input to enable the second ramp starting. The comparator (not shown in diagram) enables the second ramp to start when the ramping output from the X-Dec supply 72 and ramp generator 71 exceeds the 0.2V reference voltage. This is shown in the MTP-WL Voltage Ramp Generator graph in FIG. 22B. The output of the second ramp generator block 73 is received as one input to a differential sense amplifier 61 whose output is to the NAND gate 58 of FIG. 21A. The other input to the differential sense amplifier 61 is connected to a sample-and-hold circuit formed by a capacitor 64 and pass transistors 62 and 63.

The capacitor 64 is used to store a charge representing the voltage on the MTP-WL generated from the first ramp generator block 71, at a specific time point. The amplifier 61 is caused to generate a logic "1" when the input from the second ramp generator exceeds the voltage stored on the capacitor. See the full explanation of the operation below. The capacitor 64 is charged through the pass transistors 62 and 63 which operate as an analog pass gate. The transistors 62 and 63 pass the analog voltage from the MTP-WL to the capacitor 64 during the time interval in the Verify cycle before the thyristor of the reference memory cell or the selected Erased data memory cell, depending upon whether the operation is to Verify Programmed data memory cells or Erased data memory cells, is switched on. The use of reference memory cells or Erased data memory cells is the same as for previously described Verify operations. A transistor 65 operates to discharge the capacitor 64 after a Verify operation to reset conditions for another Verify operation.

Returning to the action of the NAND logic gates 57-59 of FIG. 21A, if one input signal to a NAND logic gate is a logic "0," the output of the gate is a logic "1" no matter what the other input is. If instead the one input signal is a logic "1," then the input of the other input is inverted, i.e., the logic gate acts as an inverter. Hence the Read operation control signal and the Program Verify/Erase Verify control signal respectively control the operations of the initial NAND gates 57 and 58 by either locking an output to a "1" when the control signal is "0," or passing the signals at the other input in inverted form at the output when the control signal is "1." Both control signals are never "1" at the same time, implying simultaneous READ and VERIFY operations is not valid. Below is a table to summarize the action of the NAND logic gates 57-59.

TABLE 4

| | | Mode/States for Logic Block 42A | | |
|---|---|---|---|---|
| Read Control | Program Verify/Erase Verify Control | Active Input to NAND gate 59 | Output of NAND gate 59 | Comments |
| Logic 1 | Logic 0 | Amplifier 41 (inverted) | Amplfier 41 | Read operation mode |
| Logic 0 | Logic 1 | Ramp measuring ckt (inverted) | Ramp measuring ckt | Verify operation mode |
| Logic 0 | Logic 0 | None | Logic 0 | No operation; standby mode |
| Logic 1 | Logic 1 | * | * | No useful state or mode |

The sense amplifier 61 and its input circuitry shown in FIG. 22A comprise the ramp measuring circuit. The circuit operates as follows: At the start of a Verify cycle the MTP-WL begins to ramp from 0V. The ramp continues to a voltage level which is one ΔVT above 0V, where ΔVT is the required final minimum voltage difference between the threshold voltage of the reference cell and the threshold voltage of the data cell. At this time point (shown by the leftmost vertical line in the MTP-WLs Voltage Ramp Generator graph in FIG. 22B) a second identical ramp is initiated using block 73, as indicated by the MTP-WL Voltage Ramp Gen graph of FIG. 22B. Both ramps continue to another time point (shown by a middle vertical line cutting through both the BL Voltage and the MTP-WL Voltage Ramp Gen graphs in FIG. 22B) when the thyristor for the local reference cell switches, in the case of Program Verify, or the erasing data cell switches, in the case of Erase Verify and the bit line of the pertinent memory cell reaches a predetermined voltage (200 mV is used again in this example). The switching and rise in the bit line voltage are detected by the sense amplifier 41 in FIG. 21A. The output from amplifier 41 is used to turn off the analog pass gate (transistors 62 and 62) and so capture the MTP-WL voltage present on the MTP-WL at the time point, onto the capacitor 64.

The capacitor 64 stores the MTP-WL voltage at the switching of the local reference cell or the data cell, as the case may be, until the second ramp, which is moving one ΔVT lower than the MTP-WL ramp, achieves the same voltage stored on the capacitor. Due to the second ramp having an identical slope to the MTP-WL ramp, this time point occurs when the MTP-WL has ramped ΔVT above the point where the reference thyristor (or data thyristor, in the case of Erase Verify) switched and the bit line has reached 200 mV. (This time point is indicated by the rightmost vertical line which crosses the MTP-WLs Voltage Ramp Gen and Latch CLK ERV or PGMV graphs in FIG. 22B.) The MTP-WL voltage at this time is ΔVT above the reference cell (or data cell, in the case of Erase Verify) switching threshold voltage and the amplifier 61 switches to '1'. As shown by the Latch CLK ERV or PGMV graph in FIG. 22B, a delay pulse is started at the switching of reference or data cell and terminated when the second ramp reaches the same voltage stored on the capacitor 64. The end of the delay pulse is used to generate a latching pulse using pulse generation circuit 42B in FIG. 21A, via the logic block 42A. The pulse generator 42B provides the CLK signal for the latch 43 to capture the output from the sense amplifier 40 for the Verify operation. The delay pulse is shown in the Latch CLK ERV or PGMV graph in FIG. 22B. For comparison's sake, the Latch CLK Read graph in FIG. 22B shows how the latching pulse appears for Read mode. The delay pulse, generated in this manner, causes the sense latch 43 to capture data from the sense amplifier 40 at a time point dependent only on the required ΔVT and is valid for a range of MTP-WL ramp rates.

As described above, the present invention provides for MTP-thyristor cells with thinner oxides, which operate with lower practical voltages for Programming (PGM) and Erasing (ER), with smaller quantities of stored charges and allow for larger device variations. In particular, smaller threshold differences ΔVT can be used for Read and Verify operations.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A method of verifying a logic state of a selected data memory cell in an array of interconnected memory cells after programming or erasing the selected data memory cell, comprising:
   increasing a word line voltage applied to the selected data memory cell and a reference memory cell associated with the selected data memory cell;
   latching an output of a first sense amplifier at a delayed time after a logic state of an output of a second sense amplifier is switched responsive to increasing the word line voltage, an amount of time between the switching of the logic state of the output of the second sense amplifier and the delayed time representing separation between a threshold voltage of the reference memory cell and a threshold voltage of the selected data memory cell, wherein:
      when verifying programming of the selected data memory cell, the output of the first sense amplifier is an amplified version of an output of the selected data memory cell, and the output of the second sense amplifier is an amplified version of the output of the reference memory cell, and
      when verifying erasing of the selected memory cell, the output of the first sense amplifier is an amplified version of the output of the reference memory cell, and the output of the second sense amplifier is an amplified version of the output of the selected data memory cell; and
   determining whether the selected data memory cell has been programmed, or has been erased based on a value of the latched output of the first sense amplifier.

2. The method of claim 1, wherein the logic state of the second sense amplifier is switched when an input voltage to the second sense amplifier rises above a predetermined amount.

3. The method of claim 2, wherein the predetermined amount comprises 200 mV.

4. The method of claim 1, further comprising:
   re-programming the selected data memory cell if the selected data memory cell has not been verified to be programmed; or
   re-erasing the selected data memory cell if the selected data memory cell has not been verified to be erased.

5. The method of claim 1, wherein the word line voltage is ramped at a rate less than 100 mV/s.

6. The method of claim 1, wherein a voltage on a common electrode for gates of transistors in the selected data memory cell and a reference memory cell associated with the selected data memory cell is increased responsive to increasing the word line voltage.

7. The method of claim 1, wherein the amount of time is predetermined.

8. A memory cell reading circuitry for reading a selected memory cell selected from an array of interconnected memory cells, comprising:
   a ramp generation block configured to increase a word line voltage applied to the selected memory cell and a reference memory cell corresponding to the selected memory cell, the word line voltage starting at an initial voltage;
   a first differential sense amplifier configured to receive an output of the selected memory cell, and generate an amplified version of the output of the selected memory cell;
   a circuit configured to generate a signal responsive to an output of the reference memory cell reaching a first predetermined voltage level, the circuit comprising a pulse generation circuit configured to generate a pulse signal responsive to an output of the reference memory cell reaching the first predetermined voltage level, the word line voltage returning to the initial voltage at an end of the pulse signal; and
   a latch circuit configured to latch the amplified version of the output of the selected memory cell responsive to receiving the signal generated by the circuit, the latched amplified version of the output of the selected memory cell representing a logic state of the selected data memory cell.

9. The memory cell reading circuitry of claim 8, wherein the first differential sense amplifier comprises a first input configured to receive the output of the selected data memory cell, and a second input configured to receive a first reference voltage.

10. The memory cell reading circuitry of claim 9, wherein the first differential sense amplifier is configured to receive the output of the selected data memory cell through a bit line connected to the selected data memory cell.

11. The memory cell reading circuitry of claim 10, wherein the bit line is connected to a cathode of a thyristor of the selected data memory cell.

12. The memory cell reading circuitry of claim 8, wherein the circuit comprises a second differential sense amplifier having an output connected to the pulse generation circuit, a first input configured to receive the output of the reference memory cell and a second input configured to receive a second reference voltage, the second reference voltage equal to the first predetermined voltage level.

13. The memory cell reading circuitry of claim 12, wherein the first input of the second differential sense amplifier is configured to receive the output of the reference memory cell through a bit line connected to the reference memory cell.

14. The memory cell reading circuitry of claim 13, wherein the bit line is connected to a cathode of a thyristor of the reference memory cell.

15. The memory cell reading circuitry of claim 8, wherein the circuit comprises a second differential sense amplifier having an output connected to the pulse generation circuit, a first input configured to receive the output of the reference memory cell and a second input configured to receive a second reference voltage, the first and second reference voltages equal to the first predetermined voltage level.

16. The memory cell reading circuitry of claim 8, wherein the initial voltage comprises zero voltage.

17. The memory cell reading circuitry of claim 8, the first differential sense amplifier is configured to compare the output of the selected data memory cell against a second predetermined voltage level.

18. The memory cell reading circuitry of claim 17, wherein the first predetermined voltage level is equal to the second predetermined voltage level and the logic state latched is dependent upon whether the output of the selected data memory cell reaches the first predetermined voltage level earlier than the output of the reference memory cell reaches the first predetermined voltage level.

19. The memory cell reading circuitry of claim 18, wherein the logic state latched is in a programmed state when the output of the reference memory cell reaches the first predetermined voltage level earlier than the output of the selected data memory cell reaches the first predetermined voltage level.

20. The memory cell reading circuitry of claim 18, wherein the logic state latched is in an erased state when the output of the selected data memory cell reaches the first predetermined voltage level earlier than the output of the reference memory cell reaches the first predetermined voltage level.

* * * * *